US008592800B2

(12) United States Patent
Moustakas et al.

(10) Patent No.: US 8,592,800 B2
(45) Date of Patent: Nov. 26, 2013

(54) OPTICAL DEVICES FEATURING NONPOLAR TEXTURED SEMICONDUCTOR LAYERS

(75) Inventors: Theodore D. Moustakas, Dover, MA (US); Adam Moldawer, Gainesville, FL (US); Anirban Bhattacharyya, Boston, MA (US); Joshua Abell, Washington, DC (US)

(73) Assignee: Trustees of Boston University, Boston, MA (US)

( * ) Notice: Subject to any disclaimer, the term of this patent is extended or adjusted under 35 U.S.C. 154(b) by 605 days.

(21) Appl. No.: 12/920,391

(22) PCT Filed: Mar. 9, 2009

(86) PCT No.: PCT/US2009/036554
§ 371 (c)(1),
(2), (4) Date: Oct. 21, 2010

(87) PCT Pub. No.: WO2009/111790
PCT Pub. Date: Sep. 11, 2009

(65) Prior Publication Data
US 2011/0024722 A1 Feb. 3, 2011

Related U.S. Application Data

(60) Provisional application No. 61/068,605, filed on Mar. 7, 2008.

(51) Int. Cl.
*H01L 29/06* (2006.01)
(52) U.S. Cl.
USPC .......... 257/13; 257/14; 257/15; 257/E33.008; 257/E33.025; 257/E21.09; 438/46; 438/478; 438/590; 438/591

(58) Field of Classification Search
None
See application file for complete search history.

(56) References Cited

U.S. PATENT DOCUMENTS

| 4,147,564 A | 4/1979 | Magee et al. |
| 4,342,944 A | 8/1982 | Spring Thorpe |
| 4,664,748 A | 5/1987 | Ueno et al. |
| 5,040,044 A | 8/1991 | Noguchi et al. |
| 5,248,621 A | 9/1993 | Sano |
| 5,309,001 A | 5/1994 | Watanabe et al. |
| 5,456,762 A | 10/1995 | Kariya et al. |
| 5,684,309 A | 11/1997 | McIntosh et al. |
| 5,779,924 A | 7/1998 | Krames et al. |

(Continued)

FOREIGN PATENT DOCUMENTS

| JP | 60173829 | 9/1985 |
| WO | WO 02/065553 | 8/2002 |

OTHER PUBLICATIONS

Sharma et al., "Outlook for High Efficiency Solar Cells to Be Used With and Without Concentration", Energy Conyers. Mgmt. vol. 36 (4), 1995 Elsevier Science Ltd., pp. 239-255.

(Continued)

*Primary Examiner* — Yasser Abdelaziez
(74) *Attorney, Agent, or Firm* — Preti Flaherty Beliveau & Pachios LLP

(57) ABSTRACT

A semiconductor emitter, or a precursor therefor, has a substrate and one or more textured semiconductor layers deposited onto the substrate in a nonpolar orientation. The textured layers enhance light extraction, and the use of nonpolar orientation greatly enhances internal quantum efficiency compared to conventional devices. Both the internal and external quantum efficiencies of emitters of the invention can be 70-80% or higher. The invention provides highly efficient light emitting diodes suitable for solid state lighting.

18 Claims, 16 Drawing Sheets

(56) References Cited

U.S. PATENT DOCUMENTS

| | | |
|---|---|---|
| 5,814,839 A | 9/1998 | Hosoba |
| 5,891,264 A | 4/1999 | Shinohara et al. |
| 5,977,477 A | 11/1999 | Shiozaki |
| 5,986,204 A | 11/1999 | Iwasaki et al. |
| 5,990,496 A | 11/1999 | Kunisato et al. |
| 6,091,083 A | 7/2000 | Hata et al. |
| 6,099,970 A | 8/2000 | Bruno et al. |
| 6,133,589 A | 10/2000 | Krames et al. |
| 6,163,038 A | 12/2000 | Chen et al. |
| 6,229,151 B1 | 5/2001 | Takeuchi et al. |
| 6,252,261 B1 | 6/2001 | Usui et al. |
| 6,258,618 B1 | 7/2001 | Lester |
| 6,285,698 B1 | 9/2001 | Romano et al. |
| 6,291,839 B1 | 9/2001 | Lester |
| 6,294,440 B1 | 9/2001 | Tsuda et al. |
| 6,328,456 B1 | 12/2001 | Mize |
| 6,376,864 B1 | 4/2002 | Wang |
| 6,468,347 B1 | 10/2002 | Motoki et al. |
| 6,469,324 B1 | 10/2002 | Wang |
| 6,486,499 B1 | 11/2002 | Krames et al. |
| 6,495,862 B1 | 12/2002 | Okazaki et al. |
| 6,518,598 B1 | 2/2003 | Chen |
| 6,534,336 B1 | 3/2003 | Iwane et al. |
| 6,628,249 B1 | 9/2003 | Kamikawa et al. |
| 6,649,943 B2 | 11/2003 | Shibata et al. |
| 6,733,591 B2 | 5/2004 | Anderson |
| 6,870,191 B2 | 3/2005 | Niki et al. |
| 7,186,302 B2 | 3/2007 | Chakraborty et al. |
| 7,348,600 B2 | 3/2008 | Narukawa et al. |
| 2001/0000209 A1 | 4/2001 | Krames et al. |
| 2002/0046693 A1 | 4/2002 | Kiyoku et al. |
| 2002/0070386 A1 | 6/2002 | Krames et al. |
| 2002/0074552 A1 | 6/2002 | Weeks, Jr. et al. |
| 2002/0123163 A1 | 9/2002 | Fujii |
| 2002/0127751 A1 | 9/2002 | Gardner et al. |
| 2002/0134985 A1 | 9/2002 | Chen et al. |
| 2002/0145148 A1 | 10/2002 | Okuyama et al. |
| 2002/0180351 A1 | 12/2002 | McNulty et al. |
| 2002/0197764 A1 | 12/2002 | Uemura et al. |
| 2003/0057444 A1 | 3/2003 | Niki et al. |
| 2003/0075723 A1 | 4/2003 | Heremans et al. |
| 2003/0085411 A1 | 5/2003 | Shibata et al. |
| 2003/0183827 A1 | 10/2003 | Kawaguchi et al. |
| 2004/0113163 A1 | 6/2004 | Steigerwald et al. |
| 2004/0113167 A1 | 6/2004 | Bader et al. |
| 2005/0095768 A1 | 5/2005 | Tsuda et al. |
| 2005/0185419 A1 | 8/2005 | Holman et al. |
| 2006/0054905 A1 | 3/2006 | Schwach et al. |
| 2006/0175624 A1 | 8/2006 | Sharma et al. |
| 2007/0120141 A1 | 5/2007 | Moustakas et al. |

OTHER PUBLICATIONS

Sun et al., "Enhancement of light extraction of GaN-based light-emitting diodes with a microstructure array", XP-002453008, Opt. Eng. 43 (8) (Aug. 2004), pp. 1700-1701.

Pan et al., "Improvement of InGaN-GaN Light-Emitting Diodes With Surface-Textured Indium-Tin-Oxide Transparent Ohmic Contacts", XP-002453009, IEEE Photonics Technology Letters, vol. 15 (5), May 2003, pp. 649-651.

Deckman et al; "Molecular-Scale Microporous Superlattices", *MRS Bulletin*, 1987, pp. 24-26.

Yamada et al.; "InGaN-Based Near-Ultraviolet and Blue-Light-Emitting Diodes with High External Quantum Efficiency Using a Patterned Sapphire Substrate and a Mesh Electrode", *The Japan Society of Applied Physics*, 41 (2002), pp. L1431-L1433.

Tadatomo et al., "High Output Power InGaN Ultraviolet Light-Emitting Diodes Fabricated on Patterned Substrates Using Metalorganic Vapor Phase Epitaxy", *The Japan Society of Applied Physics*, 40 (2001), pp. L583-L585.

Schnitzer et al., "30% external quantum efficiency from surface textured, thin-film light-emitting diodes", *Appl. Phys. Lett.*, 63, (16), 1993, pp. 2174-2176.

Windisch et al., "Light-Extraction Mechanisms in High-Efficiency Surface-Textured Light-Emitting Diodes", *IEEE Journal on Selected Topics in Quantum Electronics*, 8 (2), 2002, pp. 248-255.

OPTICAL DEVICES FEATURING NONPOLAR TEXTURED SEMICONDUCTOR LAYERS

CROSS REFERENCE TO RELATED APPLICATIONS

This application claims the priority of U.S. Provisional Application No. 60/068,605 filed Mar. 7, 2008 and entitled, LOW-COST BLUE/UV LEDS WITH VERY HIGH PHOTON CONVERSION AND EXTRACTION EFFICIENCY FOR WHITE LIGHTING. This application further claims the priority of U.S. Provisional Application No. 60/732,034 filed Oct. 31, 2005 and entitled, OPTICAL DEVICES FEATURING TEXTURED SEMMICONDUCTOR LAYERS. This application is also a continuation-in-part of pending U.S. application Ser. No. 11/107,150 filed Apr. 15, 2005 and entitled OPTICAL DEVICES FEATURING TEXTURED SEMICONDUCTOR LAYERS, which claims the priority of U.S. Provisional Application No. 60/562,489 filed Apr. 15, 2004 and entitled, FORMATION OF TEXTURED III-NITRIDE TEMPLATES FOR THE FABRICATION OF EFFICIENT OPTICAL DEVICES, U.S. Provisional Application No. 60/615,047 filed Oct. 1, 2004 and entitled, FORMATION OF TEXTURED III-NITRIDE TEMPLATES FOR THE FABRICATION OF EFFICIENT OPTICAL DEVICES, and U.S. Provisional Application No. 60/645,704 filed Jan. 21, 2005 and entitled, NITRIDE LEDS BASED ON FLAT AND WRINKLED QUANTUM WELLS. Further, this application is a continuation-in-part of PCT/US/2005/012849 filed Apr. 15, 2005 and entitled OPTICAL DEVICES FEATURING TEXTURED SEMMICONDUCTOR LAYERS. This application is also a continuation-in-part of U.S. application Ser. No. 11/590,687 filed Oct. 31, 2006 and entitled OPTICAL DEVICES FEATURING TEXTURED SEMMICONDUCTOR LAYERS and a continuation-in-part of PCT/US2006/042483 filed Oct. 31, 2006 and entitled OPTICAL DEVICES FEATURING TEXTURED SEMMICONDUCTOR LAYERS. Each of the above listed earlier applications is hereby incorporated by reference herein.

STATEMENT REGARDING FEDERALLY SPONSORED RESEARCH OR DEVELOPMENT

Part of the work leading to this invention was carried out with United States Government support provided under Grant No DE-FC26-04NT42275 from the United States Department of Energy and Cooperative Agreement W911NF-06-2-0040 awarded by United States Army Research Office. Thus, the United States Government has certain rights in this invention.

BACKGROUND OF THE INVENTION

A light emitting diode (LED) is a semiconductor optical device capable of producing light in the infrared, visible or ultraviolet (UV) regions. LEDs emitting in the visible and ultraviolet are made using gallium nitride (GaN) and its alloys with indium nitride (InN) and aluminum nitride (AlN). These devices generally consist of p and n-type semiconductor layers arranged into a p-n junction. In a standard LED device, semiconductor layers are evenly grown onto a polished substrate such as GaAs or sapphire. A typical semiconductor layer is composed of gallium nitride (GaN) that has been doped to be a p-type or n-type layer.

Important figures of merit for an LED are its internal quantum efficiency (IQE) and light extraction efficiency, the product of which determines the external quantum efficiency (EQE). For a typical LED the IQE depends on many factors, such as the concentration of point defects, Auger processes and device design. In the case of nitride LEDs grown along polar (0001) and (000-1) directions the internal efficiency is also reduced by the distortion of the quantum wells between the n- and p-doped layers caused by the internal electric fields. The light extraction efficiency of standard LEDs based on GaN is determined from Snell's law to be 4% per surface. An LED commonly includes several quantum wells made of a small energy gap semiconductor (well) and a wider bandgap semiconductor (barrier). Visible LEDs employ indium gallium nitride (InGaN) as the well and GaN as the barrier. Ultraviolet LEDs employ AlGaN of different compositions as both wells and barriers. The IQE of an LED device based on nitride semiconductors grown along polar direction is reduced by electric fields across its quantum wells. This phenomenon is referred to as the quantum confined Stark effect (QCSE). The QCSE affects LED light emission by red shifting the emission wavelength and reducing its IQE. To mitigate the QCSE in GaN-based LEDs grown along a polar direction the quantum wells (QWs) are typically made very thin (less than 30 Å). In such thin QWs the electron and hole wavefunctions have sufficient overlap, which allows them to recombine radiatively. However, since such thin QWs consist of a few monolayers, there are variations in the thickness of the QWs across the wafer, which influences the yield and thus the cost of the current generation of LEDs. The rather small value of light extraction efficiency in the standard LED is the result of the high refraction index of the semiconductor layer at the exit interface.

A number of approaches have been proposed to enhance the extraction of light from LEDs. For example, in GaAs LEDs, the extraction of light is affected by the absorption of the emitted light in the GaAs substrate. To mitigate this problem, one can use epitaxial lift-off and wafer bonding methods to transfer the GaAs LED structure to transparent substrates. Another approach involving the optimization of LED surface geometry (such as the truncated inverted pyramid), combined with the use of substrate minors, has pushed the extraction limit to 30%. Other approaches involve the use of a continuously variable refraction index transparent material to reduce the back-reflection at the interface. Some of these approaches have manufacturing limitations and the last one suffers from fast index-material degradation with time.

An approach that is recently becoming increasingly attractive is photon extraction from randomly micro-textured thin film surfaces. It has significantly improved extraction efficiency, with record external quantum efficiencies of 44% demonstrated at room temperature for GaAs based LEDs (Windish et al., 2000). In this reference, the textured surface was formed after the growth of the LED using lithographic methods. It turns out that, even in that case, most of the photons are still extracted from within the emission cone inside the critical angle corresponding to a flat surface. More recently improved extraction efficiency in InGaN-GaN LEDs was obtained by roughening both the p-GaN surface and the back surface of n-GaN (Wei Chih Peng et al., Appl. Phys. Lett. Vol. 89, 041116 (2006)). The back surface was roughened after a laser lift-off from the sapphire substrate. The authors claim that the optical power of the LED increases by a factor of 2.77 compared with the conventional LED consisting of flat front and back surfaces. Consequently there is still wide room for improving light extraction well beyond the present values.

The advantage of III-nitride-based LEDs grown along nonpolar directions is that there is no internal electric field perpendicular to the QWs. As a result the QWs which constitute the active region of the device are not distorted, but maintain their square structure. In such square QWs the electron and hole wavefunctions have a strong overlap and thus they recombine radiatively. An obvious advantage of non-polar III-nitride LEDs is that the thickness of the QWs can be wide (of the order of 100 Å), which will lead to improvement in the yield and thus the cost of the LEDs. Non-polar LEDs are usually grown on the (10-10) plane, which is known as the M-plane or on the (11-20) plane, which is known as the A-plane. The advantages of non-polar III-nitride LEDs are discussed in an article by Waltereit et al. (Nature Vol. 406, 265 (2000)).

Another way to reduce the polarization effects in III-nitride LEDs is to grow the devices on semi-polar planes. Semi-polar planes are the (hkil) planes in which one of the h, k Miller indices is non-zero and the 1-index is also non-zero. Examples of semi-polar planes are the (10-1-3) and (10-1-1). In general, in III-nitride LEDs grown on semi-polar planes there will be a component of internal electric field perpendicular to the QWs, and thus the QCSE is not completely eliminated as it is in nonpolar LEDs. However, there are theoretical studies indicating that in particular semi-polar planes there will be zero net piezoelectric polarization in the growth direction (Takeuchi et al., Jpn. J. Appl. Phys. Vol. 39, 413 (2000)).

In the past few years the growth of nonpolar and semi-polar blue-green LEDs, whose active region is made of InGaN/GaN MQWs, has been demonstrated. For example, a semi-polar (10-1-3) InGaN/GaN green LED was deposited on a semi-polar (10-1-3) GaN template grown on M-plane sapphire by the HVPE method. In another example (Kim et al., Phys. Stat. Sol. Vol. 1, 125, (2007)) the investigators reported an efficient M-plane InGaN/GaN quantum well LED emitting at 402 nm. This device was grown on a free standing M-plane GaN substrate. The free standing M-plane GaN substrates were sliced from C-plane GaN bulk crystals grown by a hydride vapor phase epitaxy (HVPE) method. These substrates after slicing were mechanically and chemically polished prior to epitaxial growth. The sizes of these substrates was relatively small (3×25 mm) because of the relatively small thickness of the C-plane GaN ingots. An example of efficient blue LED grown on free standing semi-polar (10-1-1) bulk GaN substrates was reported by Zhong et al. (Appl. Phys. Lett. Vol. 90, 233504 (2007)). This device was also deposited on a small size (10-1-1) GaN substrate sliced from a C-GaN ingot grown by an HVPE method.

Growth of GaN on the R-plane of sapphire leads to A-plane GaN (Eddy et. al., J. Appl. Phys. Vol. 73, 448 (1993). It was shown that three unit cells of A-plane GaN fit in one unit cell of R-plane sapphire. Recently, it was also demonstrated that depending on the nucleation conditions on the R-plane sapphire one can obtain either the non-polar (11-20) A-plane or the semi-polar (11-26) AN and GaN films on R-plane sapphire (Chandrasekaran et al., Phys. Stat. Sol. (c) Vol. 4, 1689 (2007)).

The surface morphology of nonpolar GaN films grown on the R-plane of sapphire was found to depend on the conditions of growth. For example, Craven et al., (Appl. Phys. Lett., Vol. 81, 469 (2002)) have shown that nonpolar A-plane GaN films, grown by MOCVD on R-plane sapphire using the well known two-step growth process of a low temperature GaN buffer and a high temperature epitaxial film, have a specular surface morphology. Haskell et al., (Appl. Phys. Lett. Vol. 83, 1554 (2003)) reported the growth of nonpolar A-plane GaN films with specular surface morphology by HVPE without the use of a low temperature GaN buffer. These authors point out that their films are specular and the low-angle surface features scatter light minimally.

The state of the art of the IQE of the current generation polar InGaN-based LEDs is not well developed. However, the EQE has been reported to vary from 45% to 15% for LEDs emitting in the range from 370 nm to 525 nm (Harbers et al., J. Display Technology, Vol. 3, 98 (2007)).

Thus, there remains a need to improve the EQE of solid state optical III-nitride devices.

SUMMARY OF THE INVENTION

The present invention provides a device for use as a light emitter. An emitter according to the invention is based on semiconductors prepared from textured nonpolar III-nitrides. As a result of the combined texturing and nonpolar orientation, the IQE, light extraction efficiency, and EQE are improved over conventional devices.

In one embodiment the device layers are deposited on an A-plane III-nitride template having a triangular surface morphology with the faces of the triangles being the nonpolar M-planes of the III-nitride. In other words the A-plane of the III-nitride template is terminated by two adjacent M-planes of the III-nitride intersecting at a 120° angle. The various device layers, including the bottom n-type heavily doped contact layer, the active region consisting of III-nitride MQWs, and the p-type III-nitride layers which act as the electron blocking layer and p-contact layer all, adapt the nonpolar orientation and the texture of the nonpolar M-plane faces of the III-nitride template. Thus, in this embodiment the semiconductor device is an M-plane nonpolar III-nitride p-n junction LED with III-nitride MQWs between the n- and p-layers. This type of nonpolar LED has a high IQE because of the elimination of the QCSE, but also has high light extraction efficiency because of the textured surface morphology of the top p-layer from which the light is extracted.

A textured nonpolar III-nitride template, as described above, can be produced, for example, by depositing a III-nitride film at 1000-1100° C. onto a substrate or template having a predetermined plane, such as the R-plane of sapphire, without the use of a low temperature III-nitride buffer at relatively high growth rates of 100-300 μm/h. Without intending to limit the invention in any way, it is believed that the structure of such a textured nonpolar III-nitride template arises because, during crystal growth of III-nitride films on a substrate having an appropriate predetermined plane, the (11-20) A-plane grows faster than the (10-10) M-plane, due to the higher density of atoms in the M-plane compared with the A-plane. Thus it is believed that at high growth rates the A-plane grows faster, but the growth front encounters the two adjacent slower growing M-planes, leading to a faceted surface morphology.

The texturing or "as grown" surface structure referred to herein is structure that results from equilibrium faceting during the growth of a III-nitride semiconductor material. The resulting facets may have an atomically smooth surface, with some level of defects due to imperfections arising during the growth process. The "as grown" texturing provided by the present invention excludes both the atomic scale variations or fluctuations characteristic of any material surface made of atoms, even "atomically smooth" material, as well as inadvertent imperfections present in any manufactured object. "As grown" texturing also excludes any regular or irregular structure introduced subsequent to growth of the material by mechanical means such as surface roughening by polishing or abrasion as well as lithographic texturing, although in some embodiments such surface modifications may be combined with as grown texturing.

Preferably, MQWs comprising a plurality of barrier and quantum well layers are deposited on one another as alternating semiconductor layers each replicating the original texture. The nonpolar orientation of the III-V semiconductor material assures that quantum wells have a square well shape, such that they are not distorted by internal fields due to polarization. As a result the hole and electron wavefunctions overlap, leading to efficient recombination and thus drastically improving the IQE compared to conventional devices.

Devices according to the invention can comprise any substrate capable of supporting the growth of an A-plane III-nitride material. For example, such devices can comprise substrates including but not limited to A-plane gallium nitride (GaN), A-plane aluminum nitride (AlN), A-plane indium nitride (InN), A-plane aluminum gallium nitride (AlGaN), A-plane indium gallium nitride, A-plane indium aluminum nitride, A-plane indium aluminum gallium nitride (InAlGaN), A-plane silicon carbide, A-plane zinc oxide, and R-plane sapphire. A sapphire substrate may also undergo nitridation, for example by exposure to ammonia or a nitrogen plasma, before a layer is deposited thereon.

Semiconductor layers grown on the GaN template, or on another layer in the total growth process, can be deposited by any suitable process. Examples of such deposition processes include hydride vapor phase epitaxy (HVPE), molecular beam epitaxy (MBE), metal-organic chemical vapor deposition (MOCVD), liquid phase epitaxy and laser ablation. A layer of a semiconductor device according to the invention may comprise III-nitride materials such as GaN, AN, InN or any combination of these materials. The substrate may be textured before layer growth by any appropriate method, or the substrate may be smooth and texturing may be introduced by choosing appropriate conditions of growth such that the first semiconductor layer on the substrate has a textured surface.

The semiconductor layer can comprise a dopant so that the layer is p-type or n-type.

Exemplary dopants include beryllium, selenium, germanium, magnesium, zinc, calcium, Si, sulfur, oxygen or a combination of these dopants. A layer may also be a mono or poly crystalline layer. A device of the invention also can include several p-type and n-type layers and one or more buffer layers, which generally aid layer growth. An exemplary buffer layer is a GaN semiconductor layer. A buffer layer may be deposited onto a substrate or between semiconductor layers.

The semiconductor layer for a device of the invention may be deposited to be from about 10 angstroms (Å) to 100 microns (μm) thick. The texturing of a nonpolar GaN template and the deposited layers have an average peak-to-valley distance of about 100 nanometers (nm) to 5 μm.

The present invention also provides a method of fabricating a semiconductor device. The method comprises providing a substrate and growing a first semiconductor layer on the surface of the substrate. The first layer can be textured spontaneously as grown or textured by a textured surface of the layer below, serving as a template. The substrate or first layer can then be used as a template to deposit other semiconductor layers having the same texture as the template. In a preferred embodiment, a fabrication method includes growing several quantum wells. The multiple quantum wells are textured by the first layer, substrate or a combination thereof.

DESCRIPTION OF THE DRAWINGS

Other features and advantages of the present invention will be apparent from the detailed description of the invention that follows, taken in conjunction with the accompanying drawings as described below.

FIG. 6a shows an (11-20) GaN layer in cross section by scanning electron microscopy (SEM), and FIG. 6b shows the surface of the same GaN layer by SEM. FIGS. 6c and 6d show a cross-section at a (10-10) triangular face of A-GaN by high resolution transmission electron microscopy (TEM), showing an atomically smooth surface.

FIG. 14a is a low magnification image showing the plurality of QWs, and FIG. 14b is a high resolution image of the same QWs. The facets of these QWs are smooth because they are deposited on the inclined M-planes of a GaN template similar to that shown in FIGS. 6c and 6d; the individual facets of the template are atomically smooth.

DETAILED DESCRIPTION OF THE INVENTION

An LED or photodetector of the present invention has high light extraction efficiency and IQE. Light extraction efficiency is improved over conventional devices by using a textured emitting surface which is replicated through the process of applying layers from an initial semiconductor template layer.

Control over growth rate and use of appropriate deposition procedures will form a textured surface layer on the initial substrate. This texture is replicated through subsequent layers as they are applied resulting in an emitting layer that has greatly improved light extraction efficiency.

Improvement in IQE of an LED is achieved through the incorporation of MQWs, in the p-n junction. This results in better confinement of injected electrons and holes from the n- and p-sides respectively and thus more efficient radiative recombination.

When a semiconductor device containing quantum wells is grown on a polar orientation the resulting quantum wells are distorted, resulting in separation of the holes and electrons. This places the electron-hole wavefunctions farther apart, reducing the efficiency of hole-electron recombination for the generation of light. The LED of the present invention overcomes this deficiency by growing the quantum wells on a nonpolar surface. In this way the quantum wells are square and not distorted, and thus the electrons and holes in the wells recombine more efficiently than in quantum wells grown in the polar orientation.

Figure 1:
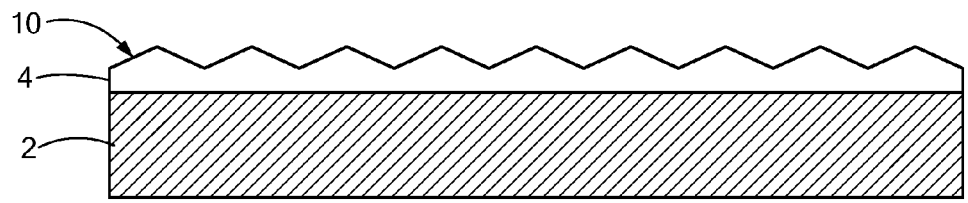
FIG. 1 is a partial representation of a textured nonpolar III-V template of the invention.
Figure 2A:
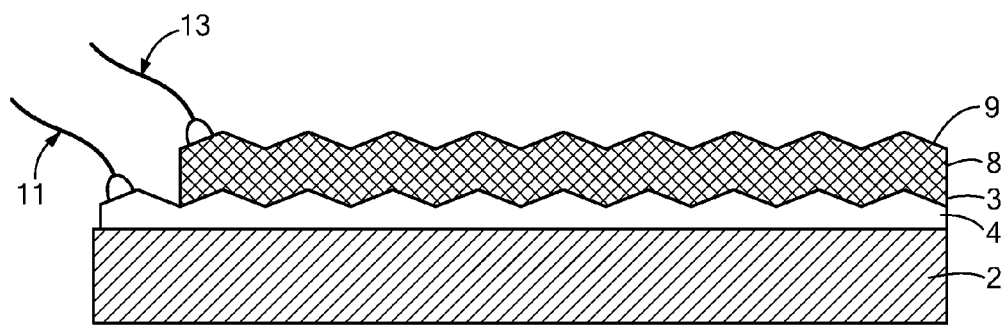
FIGS. 2a and 2b are partial representations of a semiconductor layer deposited onto the textured template of FIG. 1 to form a p-n junction.
Figure 2B:
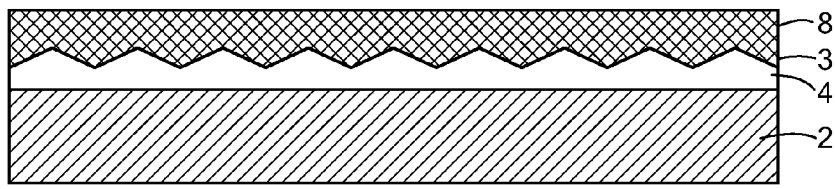

In one embodiment of the LED according to the present invention the LED is formed on a substrate 2 with a textured nonpolar III-V semiconductor layer 4 deposited onto the substrate as shown in FIG. 1 and FIGS. 2a and 2b, more fully discussed below. The layer is textured as grown on the substrate so as to have a textured surface topology (or morphology) 10. The substrate and textured layer can be used as a template for the growth of multiple semiconductor layers to form the LED. For example, a device may comprise a second layer deposited onto the first textured layer. These layers can be doped to form a p-n junction for an LED. Appropriate dopants can include selenium, germanium, zinc, magnesium, beryllium, calcium, Si, sulfur, oxygen or any combination thereof. Each of the semiconductor layers can be textured by replication from the first grown layer and its textured surface to have a textured emitting surface of improved extraction efficiency.

Figure 3A:
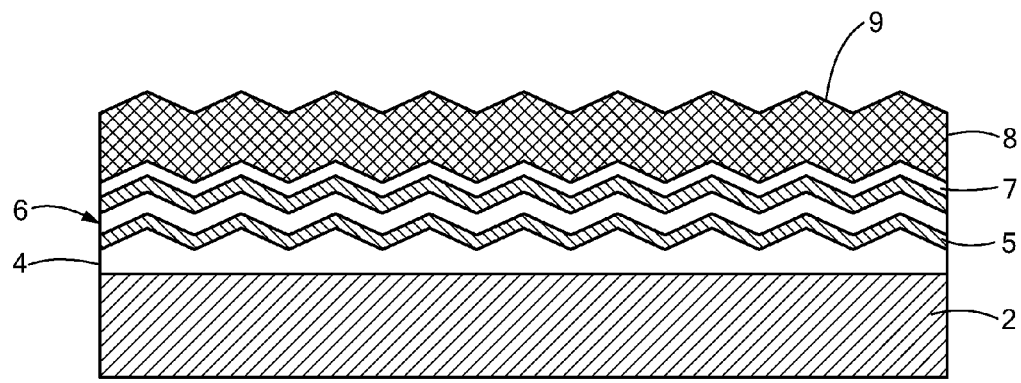
FIGS. 3a and 3b are partial representations of multiple quantum wells and a semiconductor layer deposited onto the textured template of FIG. 1.

In another embodiment, as shown in FIGS. 3a, b, FIGS. 4a, b, and FIGS. 5a, b, more fully discussed below, multiple quantum wells comprising a plurality of barrier and quantum well layers are deposited on one another as alternating semiconductor layers between the n- and p-doped layers of the device. As used herein, the term "quantum well" refers to a quantum well layer together with an adjacent barrier layer. The multiple quantum wells are textured by replication from the textured surface of the first layer as they are grown thereon.

A cladding layer of n-doped AlGaN of variable thickness can be grown between the textured layer and the quantum wells.

Suitable templates that can be used for growth of the first layer will induce the first layer to grow in a nonpolar orientation such as in an A-plane orientation with respect to the plane of the template. Exemplary templates include R-plane sapphire, A-plane gallium nitride (GaN), A-plane aluminum nitride (AlN), A-plane silicon carbide, and A-plane zinc oxide. A preferred template is textured A-plane GaN grown on an R-plane sapphire substrate.

A substrate for a device of the invention can be prepared for semiconductor layer growth by chemically cleaning a growth surface. The growth surface of the substrate should be epipolished. The substrate, such as an R-plane sapphire substrate, may also be thermally out-gassed prior to layer growth. The surface of an R-plane sapphire substrate can be optionally exposed to activated nitrogen to induce nitridation, such as disclosed in U.S. Pat. No. 6,953,703, which is incorporated by reference herein.

A semiconductor layer may be grown by processes such as hydride vapor phase epitaxy (HVPE), an alternative name for which is halide vapor phase epitaxy, MOCVD or MBE, liquid phase epitaxy (LPE), laser ablation and variations of these methods. Typical growth processes have been disclosed in U.S. Pat. Nos. 5,725,674, 6,123,768, 5,847,397 and 5,385,862, which are incorporated by reference herein. The nitride semiconductor layer typically will be grown in the presence of nitrogen. Examples of a nitride layer are GaN, InN, AlN and their alloys.

FIG. 1 shows a partial representation of a semiconductor device of the invention. In a preferred embodiment, the device is textured and comprises a substrate 2 and template 4 or first layer 4 textured as grown thereon. The substrate 2 can be polished smooth initially. The template 4 or first layer 4 is textured as grown on the substrate 2 to have a textured surface topology 10. Preferably, the template or first layer is grown by an HVPE deposition process on an A-plane III-N template or R-plane sapphire substrate to create the textured surface 10. The HVPE process yields a textured as grown template or first layer.

A template is a III-nitride semiconductor material that may or may not be doped, but typically is undoped, and can be used to determine the texture and growth orientation of the first layer, which is doped (typically n-doped) and deposited on the template. Alternatively, the first layer can be deposited directly on a substrate such as R-plane sapphire substrate. In such a case, the first layer is typically doped (e.g., n-doped) and will specify the texture and growth orientation for subsequent layers.

In one embodiment, the first layer 4 is a semiconductor layer comprising a group III nitride layer. The layer 4 is preferably a p or n-type semiconductor layer by suitable doping during deposition or it can be an insulating layer as for example AlN or both as shown below. A layer 4 can optionally be grown on a buffer layer deposited onto the substrate such as described in U.S. Pat. No. 5,686,738, which is incorporated by reference herein.

The thickness of the substrate 2 and layer 4 can cover a broad range, although the thickness of the layer 4 may influence the extent of texturing replicated at its surface. The texturing of the semiconductor layer affects its light extraction characteristics of LED layers grown thereon that replicate the texture. The semiconductor layer 4 is typically textured as grown in the nonpolar orientation. Layer 4 may be single crystalline material or well-oriented polycrystalline material along the non-polar direction.

FIG. 2a shows a second layer 8 grown onto the device of FIG. 1. The layer 8 can be grown by any suitable deposition process. The second layer is grown on the textured surface 10 of the first layer 4. Preferably, the second layer 8 can have an upper surface 9 that is textured by replication by the layer 4 as shown in FIG. 2a.

Preferably, the layer 8 is a semiconductor layer comprising a group III nitride. The second layer 8 is typically a p or n-type semiconductor layer opposite to the doping of layer 4. The second layer 8 may be a single crystalline semiconductor layer or a polycrystalline material well oriented along the non-polar direction. In one embodiment, the first and second layers 4 and 8 doping forms a p-n junction 3 for use as a photosensor or emitter. These devices can be used for electronic displays, solid state lights, computers or solar panels. Electrodes 11 and 13 connect to the layers 4 and 8 as appropriate for such use.

FIG. 2b depicts an embodiment in which layer 8 has been polished. Layer 8, or another layer in a device according to the invention, can be polished, for example, by chemomechanical polishing or by a planarization technique (see, e.g., WO 2007-145679A1, hereby incorporated by reference). Layer 8 can be a first layer deposited over a template or a second layer deposited over a first layer.

Figure 3B:
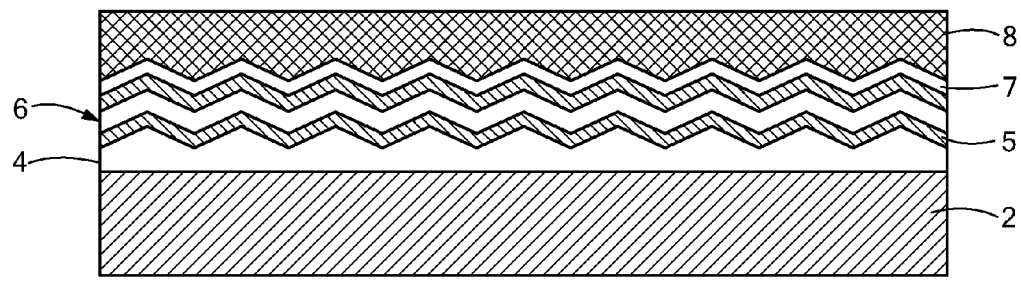

FIGS. 3a and 3b are partial representations of an LED having multiple quantum wells 6 grown onto the device of FIG. 1. The quantum wells 6 are textured by the surface topology of the first layer 4. As described above, the first layer 4 can be textured as grown onto the substrate 2. In one embodiment, the multiple quantum wells 6 can comprise one or more barrier layers 5 and alternating quantum well layers 7.

Several barrier layers 5 and quantum well layers 7 can be grown as alternating semiconductor layers each replicating the textured first layer 4. For example, quantum wells can be formed by a barrier layer 5 grown on the first layer 2. A quantum well layer 7 is then grown onto the barrier layer 5. A second barrier layer 5 is then grown on the quantum well layer 7 followed by a second quantum well layer. In one embodiment, the composition of quantum well layer 7 and first layer 4 are matched in composition. A barrier layer 5 can have a composition that differs from both the first 4 and quantum well layer 7.

The barrier layer 5 may comprise one or more group III-V nitride compounds. In one embodiment, one or more barrier layers 5 are AlGaN. Similarly, one or more quantum well layers 7 are a group III nitride such as GaN. The layers can also be grown by any suitable deposition process. The layers may be single crystalline or polycrystalline well oriented along a nonpolar direction.

The thickness of each of the layers is typically thin enough for texturing of the layer beneath to replicate to the surface above. The extent of texturing with the layers can affect IQE and light extraction efficiency. Preferably, a device of the invention comprises from one to twenty quantum wells, each comprising a barrier layer 5 and a quantum well layer 7.

FIGS. 3a and 3b also show an upper semiconductor layer 8 grown on the multiple textured quantum wells 6. The layer 8 can be grown by a known deposition process and may be a textured layer 9 (FIG. 3a) have the textured surface planarized by the etch-back process referred to above using reactive ion etching with chlorine chemistry or by polishing the texture using chemo-mechanical polishing (FIG. 3b).

Preferably, the layer 8 is a semiconductor layer comprising a group III nitride having nonpolar (A-plane) orientation. The upper layer 8 may also be a p or n-type semiconductor layer, opposite to the layer 4 so as to form a p-n junction. The p-n junction allows functioning as a semiconductor device such as an LED or photodetector. The upper layer 8 can be a single crystalline semiconductor layer or can be polycrystalline well oriented along a nonpolar direction. The multiple quantum wells 6 can also comprise textured as grown barrier layers 5 and quantum well layers 7. For example, layers 5 and 7 may be grown by a deposition process such as HYPE, MBE, or MOCVD.

The device structure shown in FIG. 3a can exhibit internal quantum efficiencies and external light extraction efficiencies that are significantly higher than the efficiencies of a conventional device. The FIG. 3b device possesses IQE increases overall.

A device of the invention can have a light extraction efficiency approaching one-hundred (100) percent, such as 90% or more, 95% or more, 98% or more, 99% or more, 99.5% or more, or 99.9% or more. Similarly, such a device may have an IQE in the range of at least 70%, or 70% to 80% or more. Consequently, the EQE of a device according to the invention can be at least 60%, or 90% or more, 95% or more, 98% or more, 99% or more, 99.5% or more, or 99.9% or more.

Figure 4A:
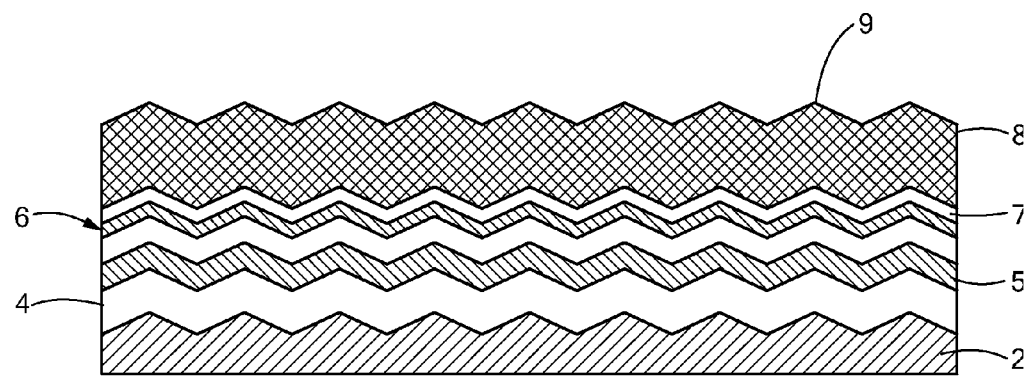
FIGS. 4a and 4b are partial representations of a substrate having a textured surface that textures semiconductor layers including multiple quantum wells deposited thereon.
Figure 4B:
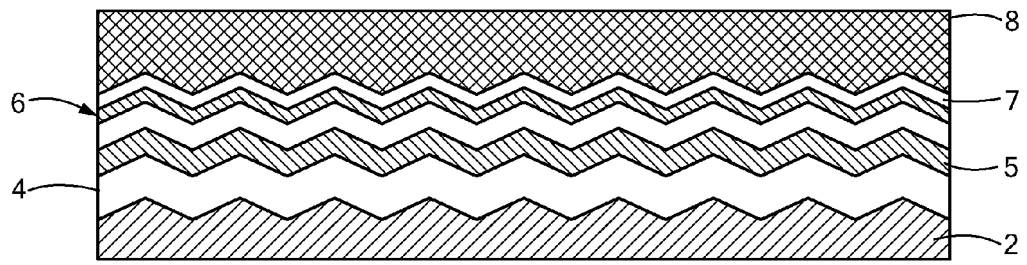

FIGS. 4a and 4b show a device with a substrate having an initial textured surface. Subsequent layers from the first layer 4 can be deposited on the textured substrate 2 such that the upper surfaces are textured by replication. Any surface texturing of the substrate should not interfere with the equilibrium faceting process of the growing A-plane III-nitride material. For example, surface texturing or lithography of the substrate can be of a larger scale that does not prevent the formation of a textured nonpolar III-nitride surface.

The device of FIG. 4a includes a textured surface 9 on layer 8, or in FIG. 4b, an untextured layer in that embodiment.

Figure 5A:
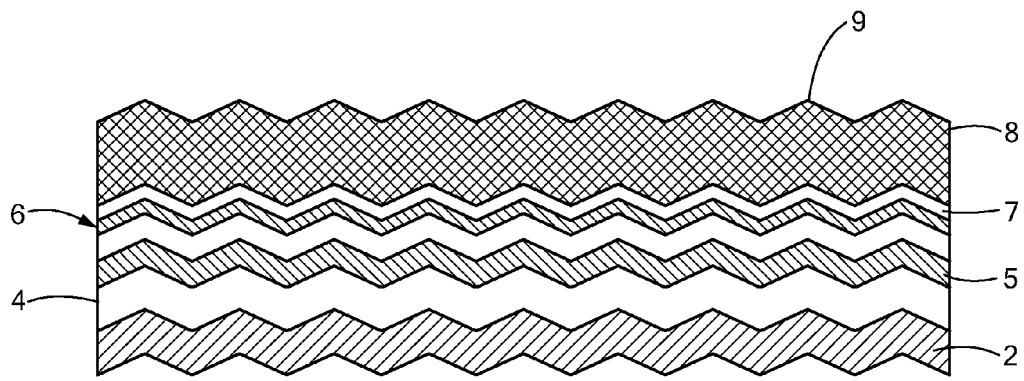
FIGS. 5a, 5b and 5c are partial representations of a substrate having textured surfaces with textured semiconductor layers including multiple quantum wells deposited thereon.
Figure 5B:
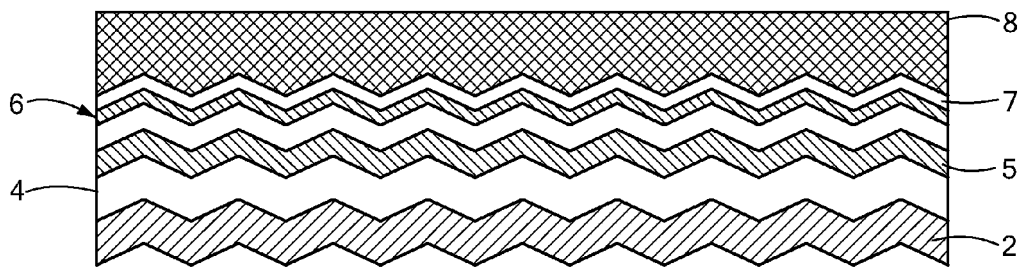

In an alternative embodiment, the substrate can comprise both upper and lower textured surfaces 9 and 15, as shown, for example, in FIG. 5a using substantially the same procedures as described above. In FIG. 5b, only bottom layer 2, surface 15 is textured and can function as an emitting surface.

Figure 5C:
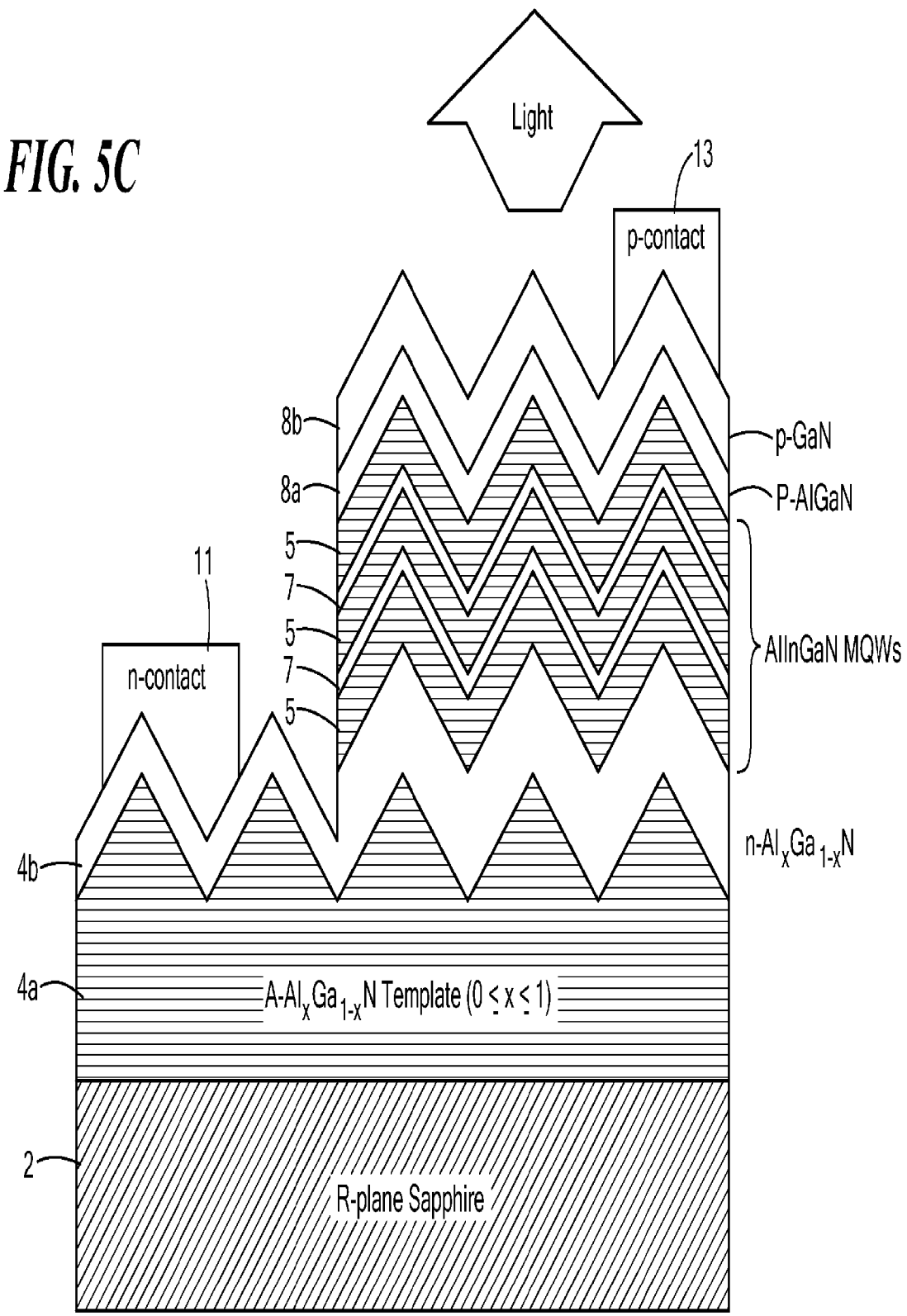

For example, FIG. 5c is an LED using a textured nonpolar AlGaN template 4a (a GaN template could also be used) on an R-plane sapphire substrate 2. The textured AlGaN template is doped n-type to act as an n-contact layer. This layer can be used with other forms of the invention described herein. Over those are p-doped layers layers 8a and 8b of AlGaN and GaN respectively. Layers 4b and 8b receive electrical connections 11 and 13 with light extraction upward through the top surface. Alternatively, the light can be extracted from the bottom side by removing the substrate using laser lift-off techniques and then texturing the back side of the AlGaN template by reactive etching. Layer 8a can be used with other forms of the invention described herein and functions as an electron blocking layer preventing the loss of electrons from the active region of the device.

The present invention also provides a method of fabricating a semiconductor device of the invention. The method comprises providing a substrate and growing a first semiconductor layer on the surface of the substrate having the triangular texture described earlier. The substrate and the first layer can then be used as a template to deposit and texture other semiconductor layers. Such a template can be sold at this stage of production, allowing others to complete the layering replicating the texture up to the emitting layer.

In a preferred embodiment, a fabrication method includes growing several quantum wells in which the wells comprise both barrier and quantum well layers that can be deposited as alternating semiconductor layers. The multiple quantum wells are textured by the first layer, substrate or a combination thereof.

This invention describes a method of forming on a substrate thick nonpolar A-plane GaN and other III-nitride films (templates) having a particular texture. Such spontaneously formed textured III-nitride templates are used as substrates for the growth of high efficiency devices such as III-nitride light emitting diodes (LEDs), solar cells and photodetectors. The high efficiency of such devices is due to two effects; (a) efficient light extraction for LEDs and other optical devices due to texturing and (b) improvements in IQE of LEDs based on textured nonpolar III-nitride MQWs due to the nonpolar orientation of the template and additional layers.

This invention relates to a method of preparing textured nonpolar Group III-nitride templates during growth of the nitride films by HYPE, MOCVD, and MBE. Furthermore, such textured nitride templates are used as substrates for the growth and fabrication of LED structures with improved IQE as well as more efficient extraction efficiency. Besides LEDs, other devices such as solar cells and photodetectors, fabricated on such textured templates are going to have improved efficiency as well. Reference is made to commonly owned U.S. Pat. Nos. 5,385,862; 5,633,192; 5,686,738; 6,123,768; 5,725,674 incorporated herein by reference.

While the internal efficiency of an LED is an inherent material and device design property, the external efficiency of such a device is a measure of light extraction efficiency from the semiconductor. The large contrast between the GaN index of refraction and the surrounding material (usually air) causes total internal reflection for most of the light produced inside the active material. For the index of refraction of GaN (n=2.5), the escape cone for internal light is limited by Snell's law within a critical angle of $\sin \theta = 1/n$, or $\theta = 23.5°$. That limits the total extracted radiation to a solid angle:

$$\Omega = 2\pi(1 - \cos \theta)$$

Thus the total fraction of light that can escape from the semiconductor can be calculated by dividing the previous expression by $4\pi$:

$$\Omega/4\pi = \frac{1}{2}(1 - \cos \theta)$$

According to this expression, only 4% of the incident radiation is extracted in a GaN based LED from one surface. Thus, in LEDs, most of the internally reflected radiation is re-absorbed, since in an LED that operates below lasing threshold, the per-pass stimulated gain is less than per-pass absorption losses.

The formation of III-nitride templates and epitaxial growth of nitride devices on such templates can be developed, for example, using three different epitaxial methods, which are described below.

The HVPE method is used for the development of GaN, AlN, and AlGaN quasi-substrates (templates). This deposition method employs HCl to transport the Ga to the substrate in the form of GaCl. Growth of GaN in the presence of HCl has also a number of additional advantages. HCl etches excess Ga from the surface of the growing film, and this enables high growth rates (100-300, 100-700, 100 or more, or 300 or more µ/hr). Finally, another advantage is the leaching of metallic impurities, which tend to contribute recombination centers in most semiconductors. Thus this method leads to very high quality GaN films.

A textured GaN template according to the invention is grown by an HVPE process. The GaN template can be grown via an HVPE reactor. In the reactor, the group III precursor can be GaCl gas, which is synthesized upstream by flowing HCl on a quartz-boat containing Ga at temperatures from about 500 C to 1000 C. GaCl gas then mixes with ammonia ($NH_3$) downstream near the surface of the substrate wafer to form GaN at temperatures between about 900 C to 1200 C. A GaN or AlN or AlGaN template of the invention can be grown along polar and non-polar directions depending on the choice of the substrate. The templates can also grow in their cubic structure by choosing a substrate having cubic symmetry such as for example (100)Si (001)GaAs. In this case the subsequent nitride layers grown on it will have cubic symmetry as well.

The HVPE reactor is generally divided into four zones in which each zone temperature can be individually controlled. The reactor also has three separate delivery tubes for the reactant gases and diluents. Nitrogen or hydrogen is used as a diluent and carrier gases to $NH_3$ and HCl. Nitrogen is sent through the middle tube where it acts as a downstream gas sheath to prevent the premixing of the GaCl and $NH_3$ before the gases contact the substrate surface.

The textured GaN templates are grown in one temperature step, usually at about 1000 C, under high growth rate conditions ranging from about 30 to 700 µm per hr that is controlled by the flow ratio of $NH_3$ to the group III precursor. The flow ratio can be, for example, about 300 to 10. Appropriate template texturing requires an adequately fast growth rate, as slower rates can result in loss of equilibrium faceting conditions. Template thickness is preferably at least 100 nm and can be as high as 5µ or more. In certain embodiments, template thickness is at least 200 nm, at least 500 nm, or at least 1000 nm.

MOCVD is the method currently used by industry for the growth of GaN-based LEDs. This method produces nitrides by the reaction of Group III-alkyls (e.g. $(CH_3)_3Ga$ or $(C_2H_5)_3Ga$) with $NH_3$. One problem with this method is the cost associated with the high consumption of $NH_3$. Growth of GaN films at 1 µ/hr requires 5 to 10 lpm of $NH_3$.

The MBE method forms III-nitrides by the reaction of Group III elements with molecular nitrogen activated by various forms of RF or microwave plasmas. An alternative approach is the reaction of Group III elements with ammonia on a heated substrate. The Group III elements can be either evaporated from effusion cells or provided in the form of Group III alkyls. It is generally believed that products produced by the MBE method are more expensive due to throughput issues. However, in the growth of nitrides, a significant part of the cost is determined by the consumption of nitrogen precursors. During MBE growth of nitride devices, one employs approximately 1 to 50 sccm of nitrogen or ammonia, which is several orders of magnitude less than what is employed during MOCVD growth. This together with the fact that MBE production equipment employs multi-wafer deposition systems makes the MBE method attractive for the development of inexpensive nitride devices. InGaN-based laser diodes have been produce by the MBE method [Hooper et al., Electronics Letters, Vol. 40, 8 Jan. 2004].

The examples herein are provided to illustrate advantages of the present invention. The examples can include or incorporate any of the variations or embodiments of the invention described above. The embodiments described above may also each include or incorporate the variations of any or all other embodiments of the invention. The following examples are not intended in any way to limit the scope of the invention.

EXAMPLE I

Growth of a Textured Nonpolar GaN Template by HVPE

The textured non-polar A-plane GaN template was deposited on an R-plane sapphire substrate at 1000° C. by an HVPE method carried out in a vertical hydride vapor phase epitaxy (HVPE) reactor. The reactor consisted of concentric quartz tubes encased in a four zone furnace. Hydrogen chloride gas was carried into the centermost tube by nitrogen, where it reacted with liquid gallium in a boat to form GaCl. Ammonia was supplied through the outermost tube. A funnel was added at the point where the GaCl and $NH_3$ meet to better shape the gas flows around the rotational sample stage.

A-GaN templates were grown directly onto (10-12) R-plane sapphire at a Zone 3 held at temperature of 1000° C. without the use of a GaN buffer layer. This is in contrast to the standard procedure of growing polar C—GaN templates which involves the growth of a low temperature GaN buffer layer before continuing with a high temperature growth phase. Gas flow rates were chosen for the respective tubes such that a laminar gas flow pattern was seen from the centermost tube to the sample stage. This was accomplished by flowing approximately 2000 sccm of nitrogen through the centermost tube, while flowing 2000-3000 sccm of nitrogen through the outer tube. Utilizing these flow conditions, the templates were grown under a ratio of Ga/N<<1, consisting of 60 sccm of HCl to 1500 sccm of $NH_3$. These conditions resulted in the growth of textured (11-20) A-plane GaN.

Figure 6A:
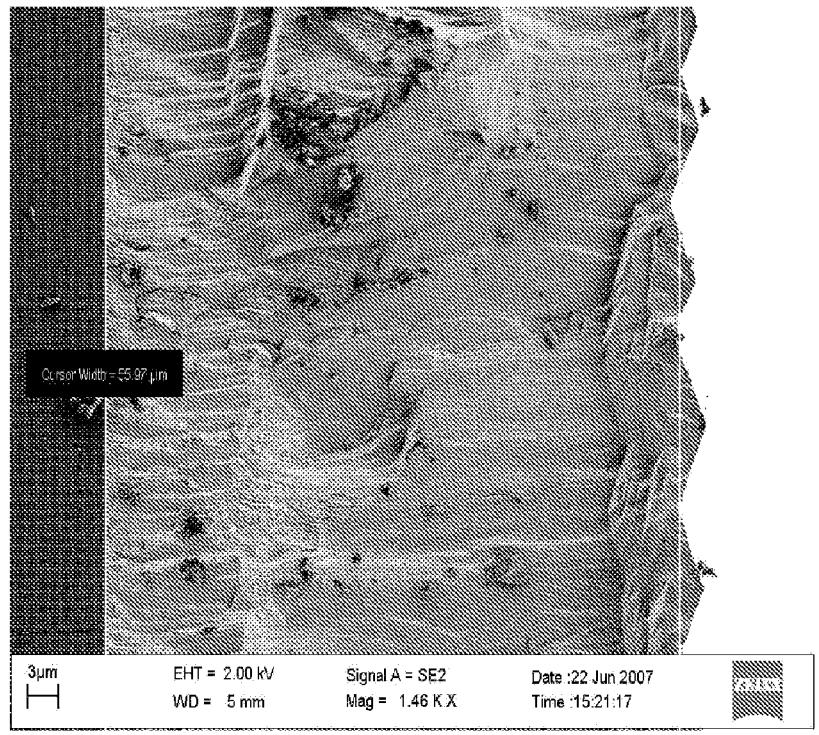
FIGS. 6a-6d are electron micrographs showing a nonpolar GaN template deposited by HVPE on R-plane sapphire. The surface texture is the result of equilibrium faceting of the A-plane of GaN.
Figure 6B:
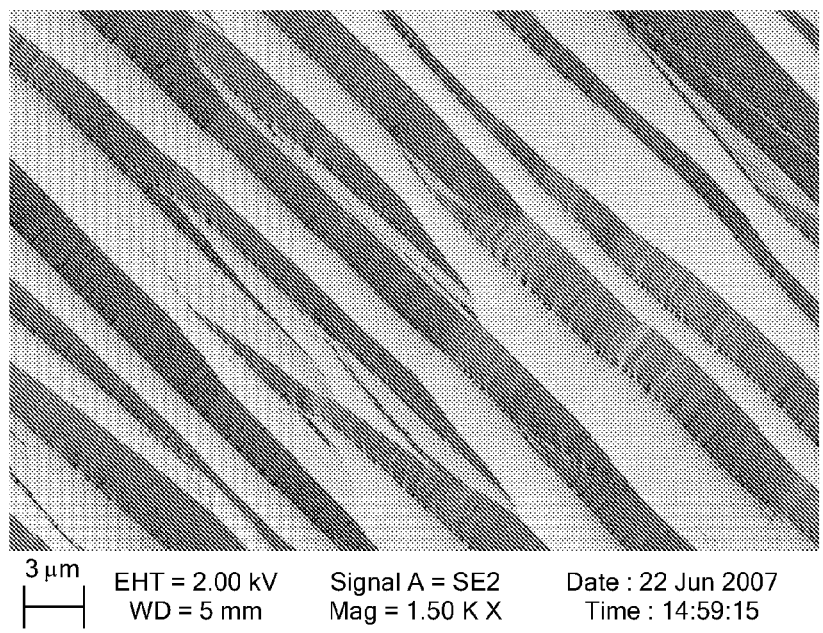
Figures 6C, 6D:
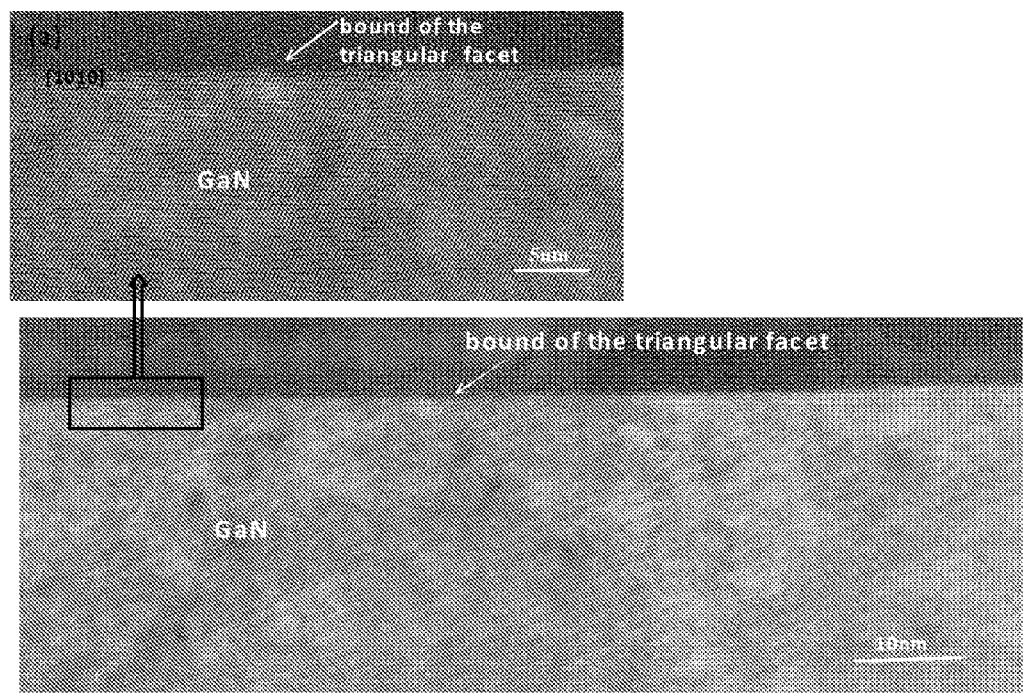

The texturing, in cross-section, resembles a saw tooth pattern that traverses the length of the GaN template. This geometry is illustrated in FIGS. 6a and 6b, for an A-GaN template grown for 20 min at a growth rate of ~165 μm/hr. Each face of the texturing can be seen to intersect its adjacent face at a 120° angle and is terminated by a (10-10) M-plane of GaN, which appeared atomically smooth (FIGS. 6c, 6d). Under these growth conditions, this morphology has been found to be the most thermodynamically stable. The A-plane orientation of these templates was confirmed through the use of X-ray diffraction.

EXAMPLE II

Reflectance of Polar and Nonpolar GaN Templates

An atomically smooth C-plane GaN template about 50 μm thick was deposited using a three-step HVPE deposition process. In the first step, a sapphire substrate was subjected to nitridation by exposing the wafer to ammonia for 60 sec at 1000° C. In the second step, a buffer layer of 200 Å was deposited at 550° C., and in the third step the final epitaxial film was deposited at 1050° C.

Figure 7:
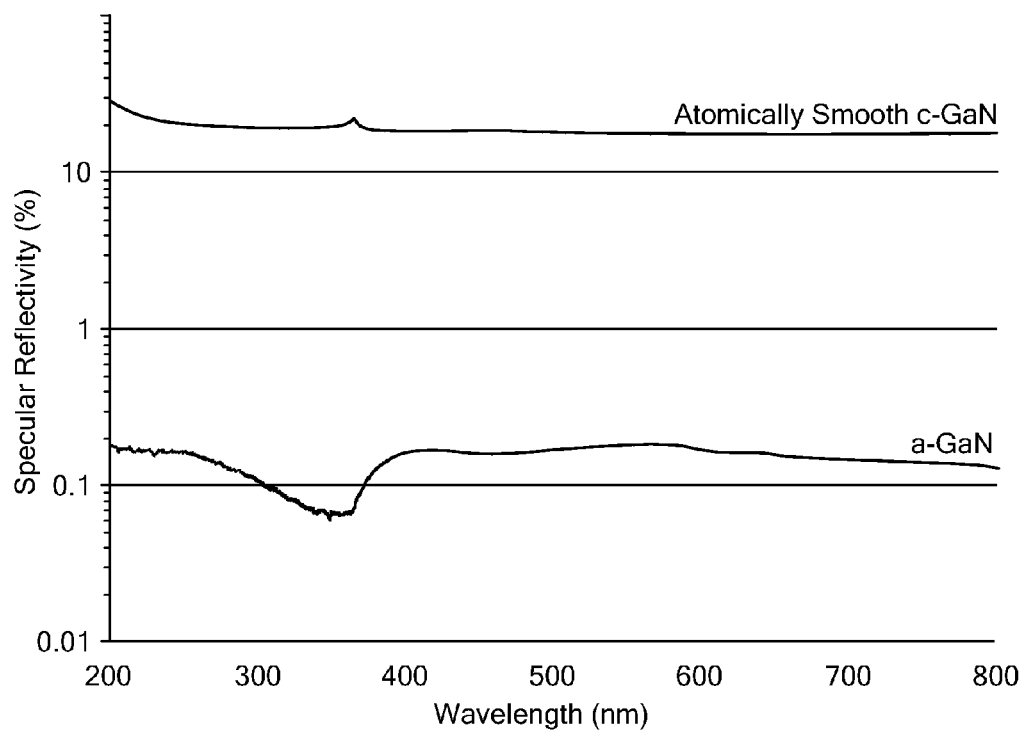
FIG. 7 shows reflectivity spectra for different GaN templates. The curve labeled "A-GaN" shows the reflectivity of A-plane GaN grown by HVPE on R-plane sapphire. The upper curve shows the reflectivity of a C-GaN template having an atomically smooth surface.

The reflectance spectrum of the smooth C-plane template and that of the textured A-plane GaN template from Example I are compared in FIG. 7.

EXAMPLE III

MQWs on a Textured Nonpolar GaN Template Emitting in the Deep UV

AlGaN/AlN MQWs were grown on a textured A-GaN template for emission in the deep UV. Similar procedures were used for the growth of AlGaN MQWs on the A-plane GaN template for near UV emission and InGaN MQWs for emission in the blue and green parts of the electromagnetic spectrum. In all cases the GaN templates were cleaned by standard degreasing steps before loading into the MBE system. Just before the growth was conducted, the surface was further cleaned by exposure to a gallium flux at a high temperature. The gallium reacted with impurities on the surface and then evaporated, leaving a pristine surface.

The wells were composed of AlGaN alloys with nominally 70% AlN mole-fraction, and barriers were of pure AlN. The well and barrier thicknesses were nominally 15 and 30 Å respectively, and 100 wells and barriers were employed.

Figure 14A:
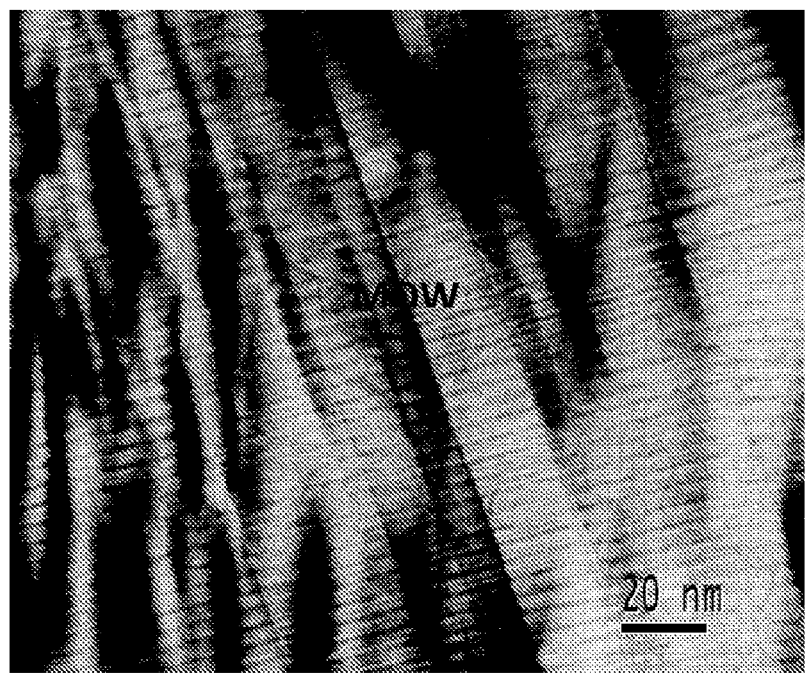
FIGS. 14a and 14b show the cross-section structure by TEM of the AlGaN/AlN MQWs referred to in FIG. 13.
Figure 14B:
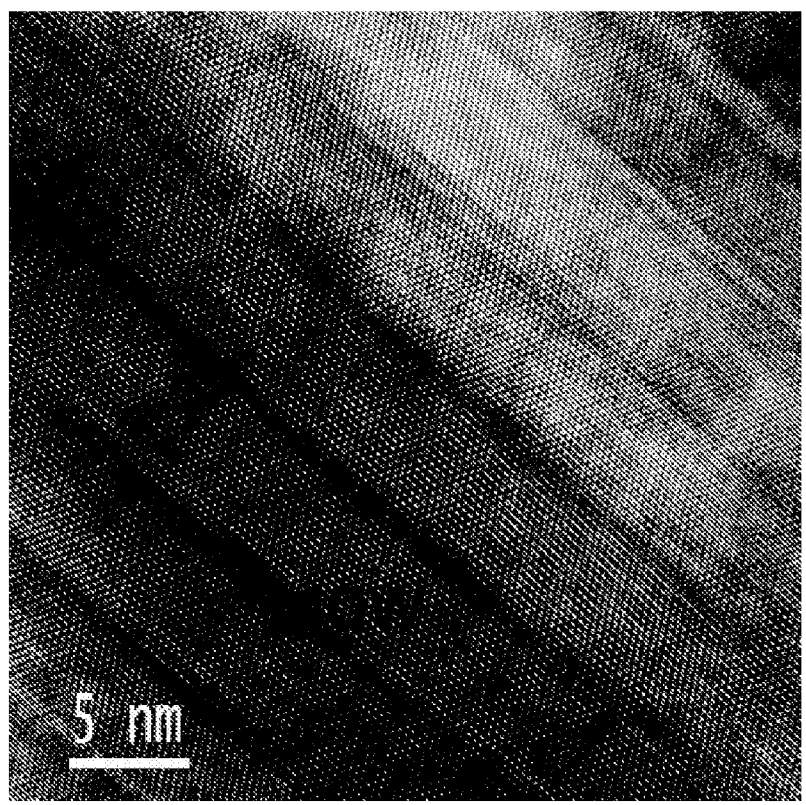

The surface structure of the MQWs by electron microscopy is shown at various magnifications in FIGS. 11a-11d. These images indicate that the MQWs mostly replicate the GaN template. FIG. 14 shows the TEM image of these QWs under low and high magnification. The MQWs wells were atomically smooth (see, e.g., FIG. 14b). This is because they were deposited on top of the M-planes of GaN templates which, as shown in FIGS. 6c and 6d, are atomically smooth.

Figure 12:
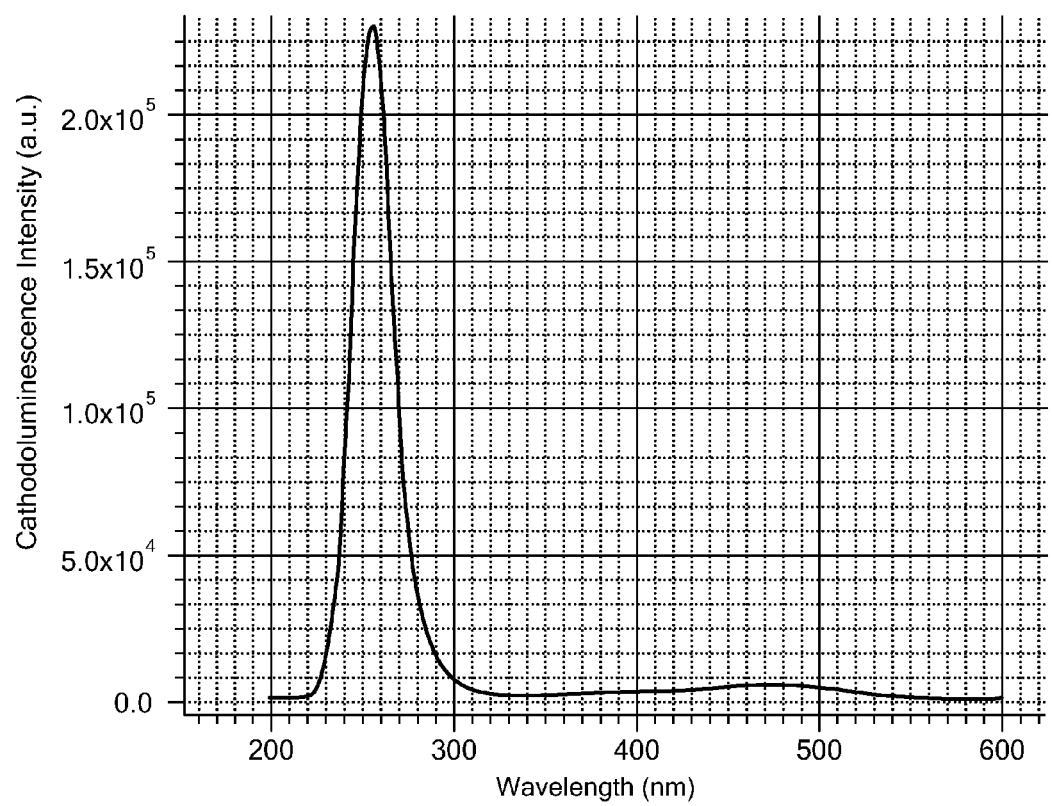
FIG. 12 shows a CL spectrum from Al0.7Ga0.3N/AlN MQWs deposited on an A-plane GaN template.

The peak cathodoluminescence emission of the MQWs occurred at 260 nm, in the deep UV range as revealed by the spectrum shown in FIG. 12. An LED prepared with such MQWs can be used for purposes of sterilization of microbes or for detection of nucleic acids.

Figure 13A:
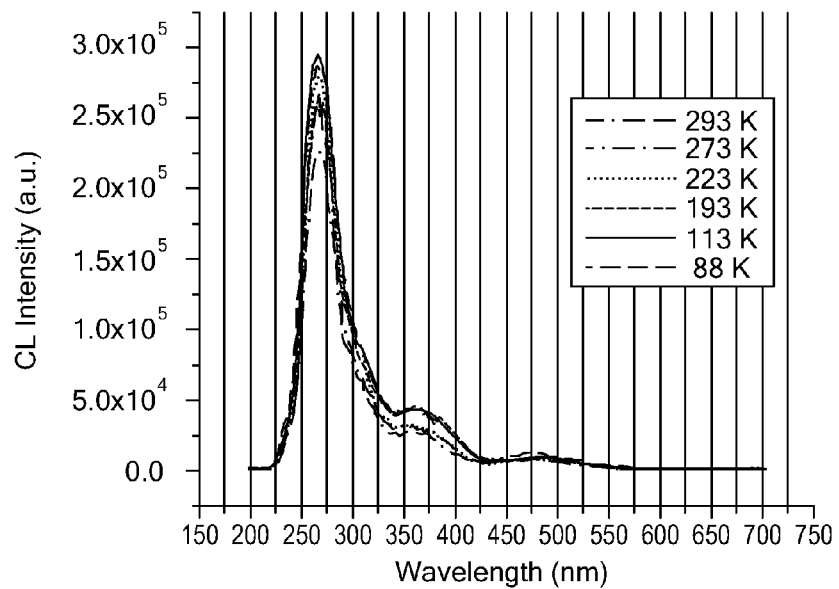
FIG. 13a shows CL spectra from AlGaN/AlN MQWs grown on an A-GaN template by MBE as a function of temperature. These MQWs had a peak emission at 266 nm.
Figure 13B:
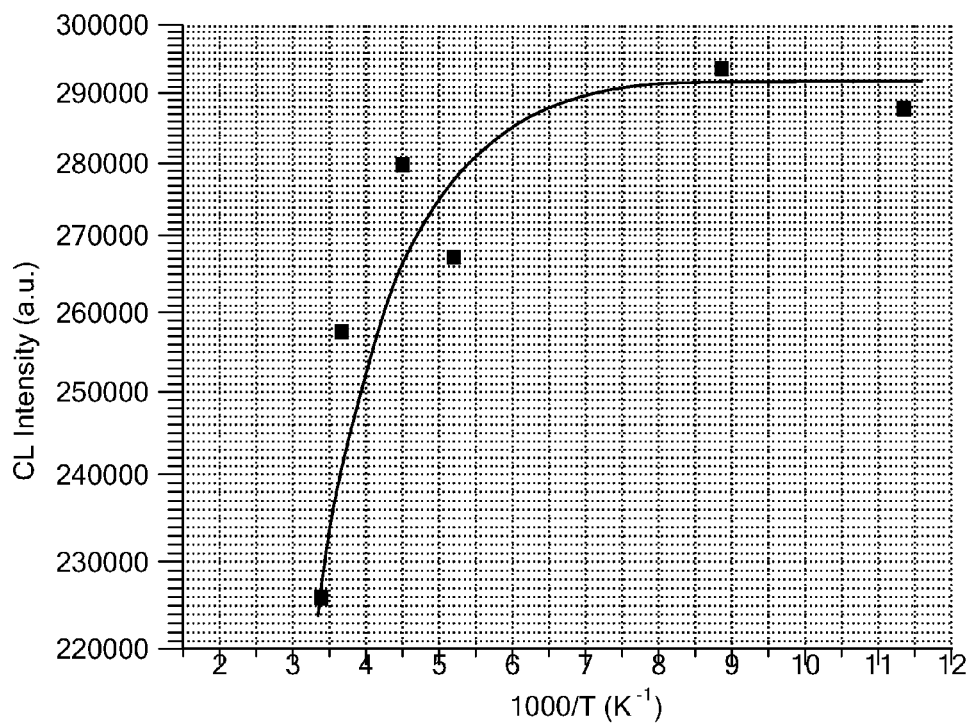
FIG. 13b shows the integrated CL intensity plotted against 1/T.

Another sample containing MQWs of $Al_{0.7}Ga_{0.3}N/AlN$ was found to have a peak CL emission at 266 nm. The integrated CL intensity was determined as a function of temperature, and the results are shown in FIGS. 13a and 13b. The IQE of this device was determined to be greater than 80%.

EXAMPLE IV

Cathodoluminescence of MQWs on Textured Nonpolar GaN Templates

Figure 8:
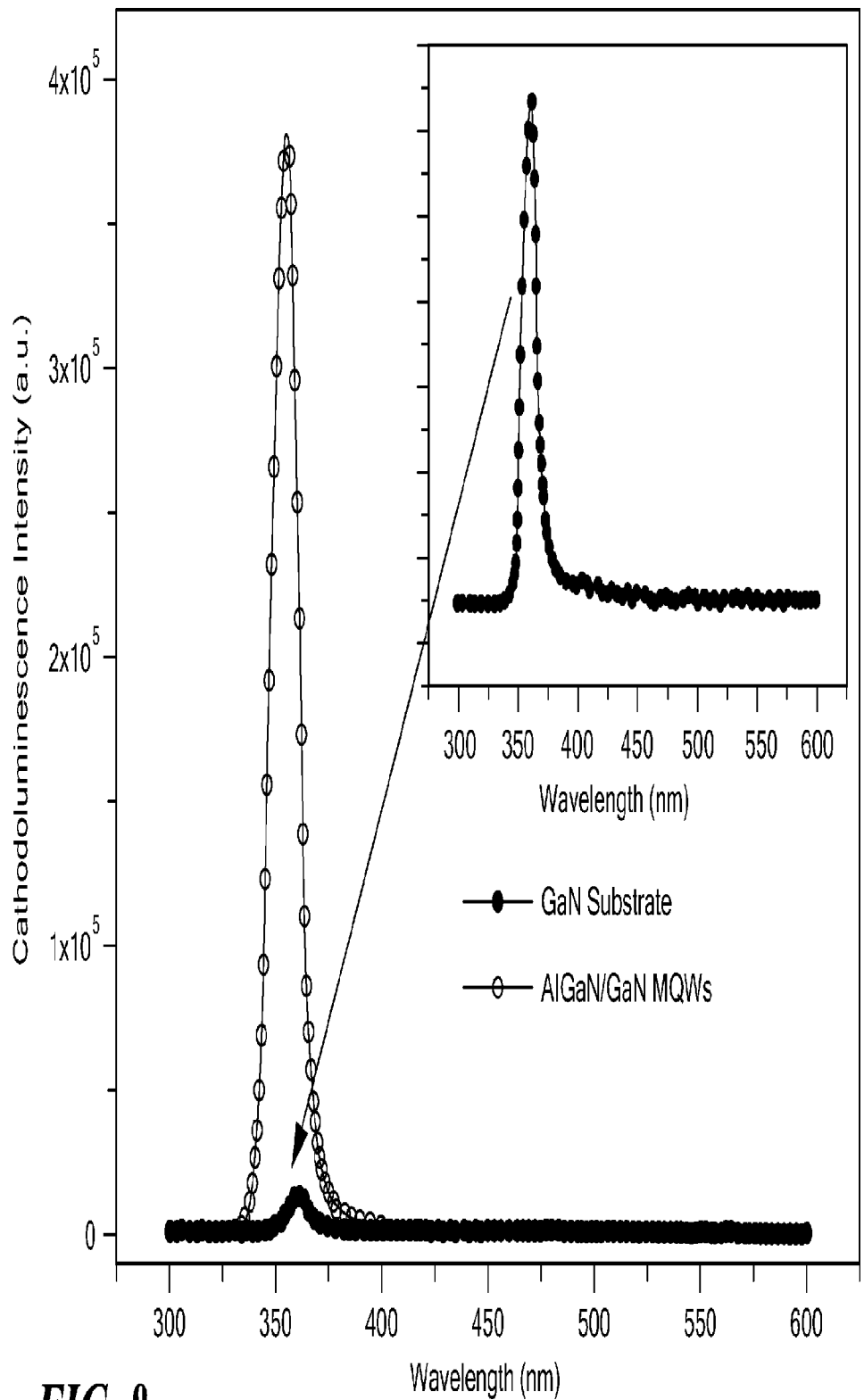
FIG. 8 shows room temperature cathodoluminescence (CL) spectra from an A-plane GaN template (inset) and from AlGaN/GaN MQWs deposited on the same GaN template.

The quality of GaN/AlGaN MQWs deposited on a textured A-plane GaN template was studied by cathodoluminescence. The results are shown in FIG. 8. The spectra from the MQWs (354 nm) was blue shifted from that of the template (364 nm).

EXAMPLE V

Photoluminescence of MQWs on Polar vs. Textured Nonpolar GaN Templates

Figure 9:
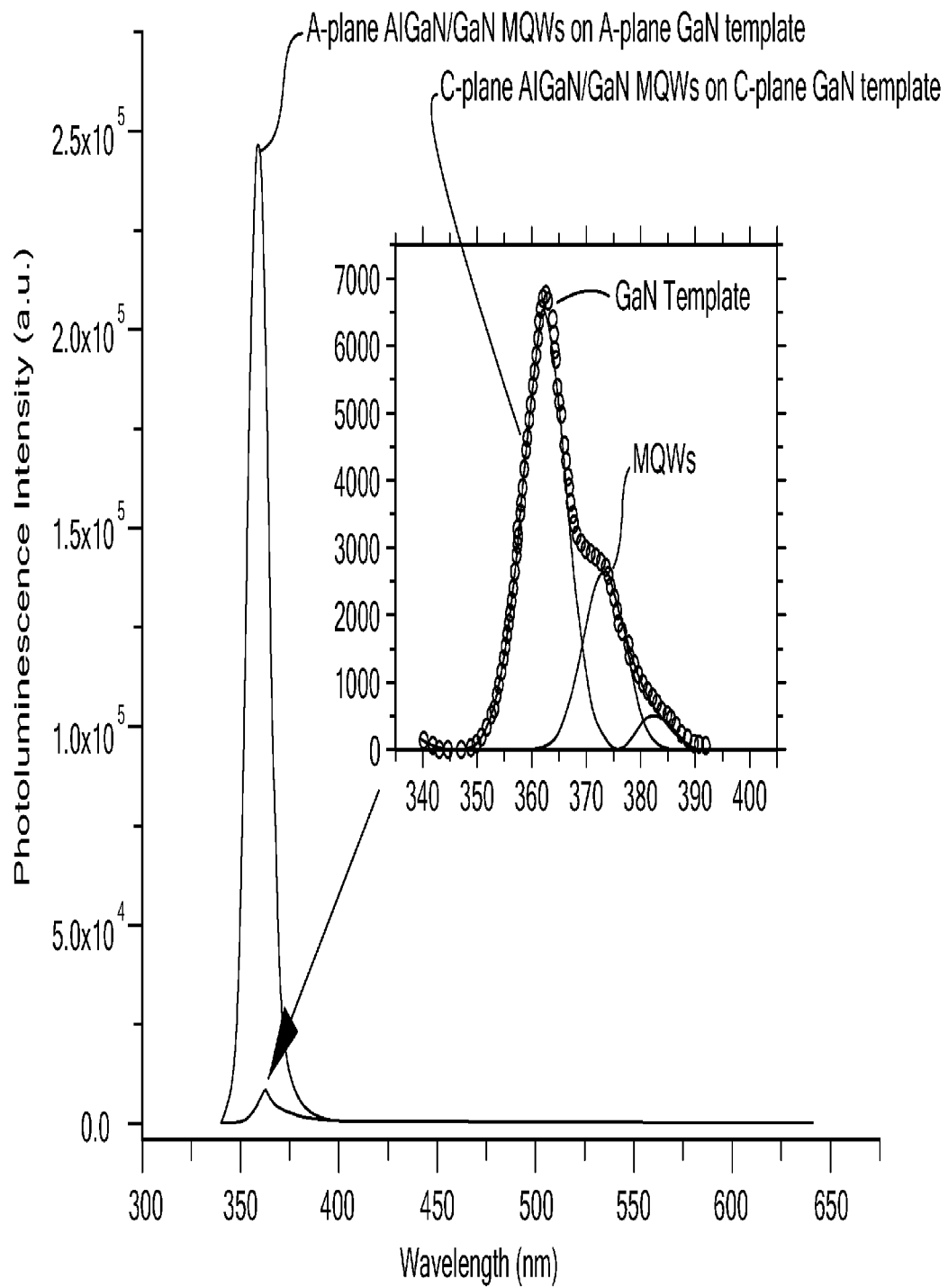
FIG. 9 compares the room temperature photoluminescence (PL) spectra for identical MQWs (7 nm GaN/AlGaN) grown on C-plane (smooth) GaN (inset) and A-plane (textured as grown) GaN templates.

FIG. 9 shows the photoluminescence spectra of two identical AlGaN/GaN MQWs, grown on a non-polar A-GaN template and polar C-plane GaN template, and designed to emit in the region of about 350 nm. The width of the GaN well was 7 nm in both MQW structures. The luminescence intensity from the nonpolar MQWs was 90 times higher than from the corresponding polar MQWs. Furthermore, the emission from the polar MQWs was red shifted. Both the enhancement in luminescence efficiency and the blue shifting of the nonpolar QWs are consistent with the elimination of the QCSE in these structures. The very intense luminescence is the result of both the increase of the IQE due to elimination of polarization effects and also the higher light extraction efficiency due to the surface texture.

Figure 10A:
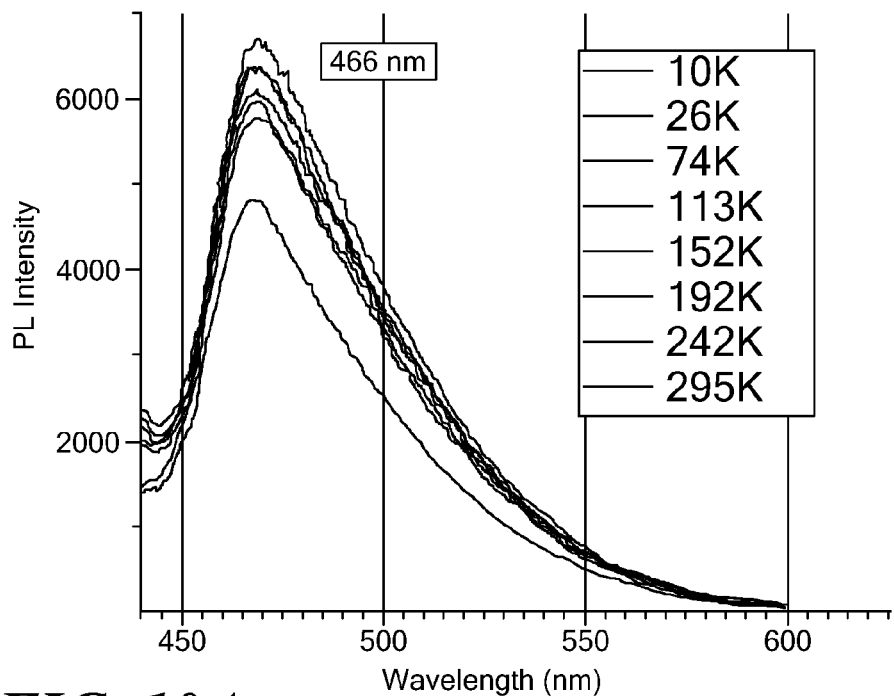
FIG. 10a shows PL spectra of InGaN/GaN MQWs on a textured as grown nonpolar A-plane GaN template measured as a function of temperature.
Figure 10B:
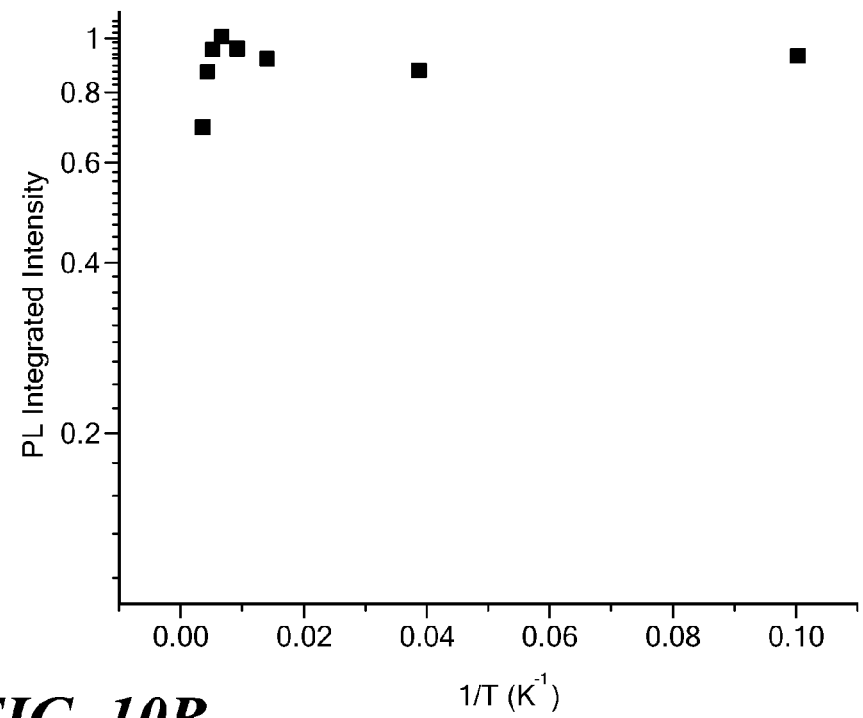
FIG. 10b shows the integrated PL intensity plotted vs. 1/T.
Figure 11A:
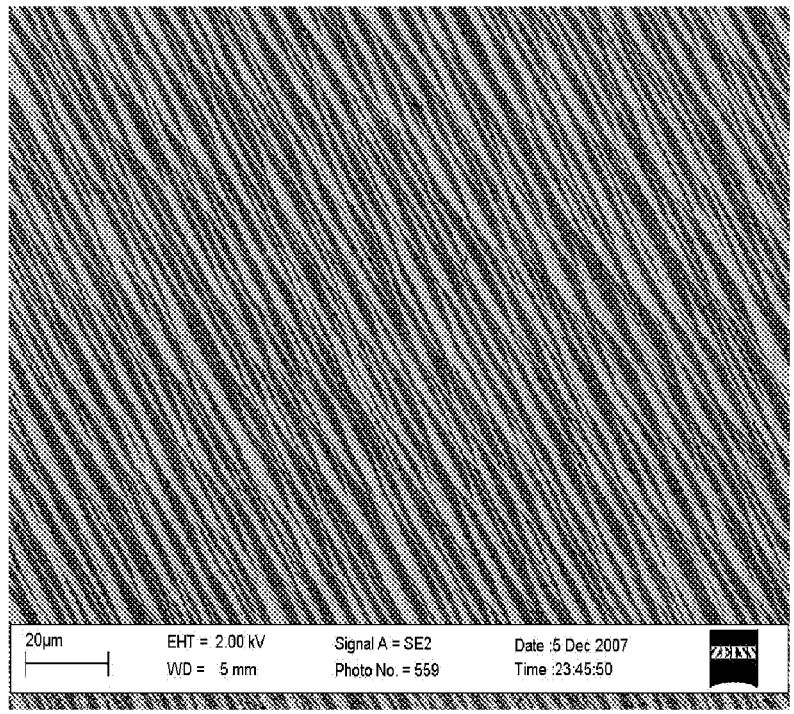
FIGS. 11a-11d show the surface morphology by SEM of AlGaN MQWs deposited on A-plane GaN templates at various magnifications.
Figure 11B:
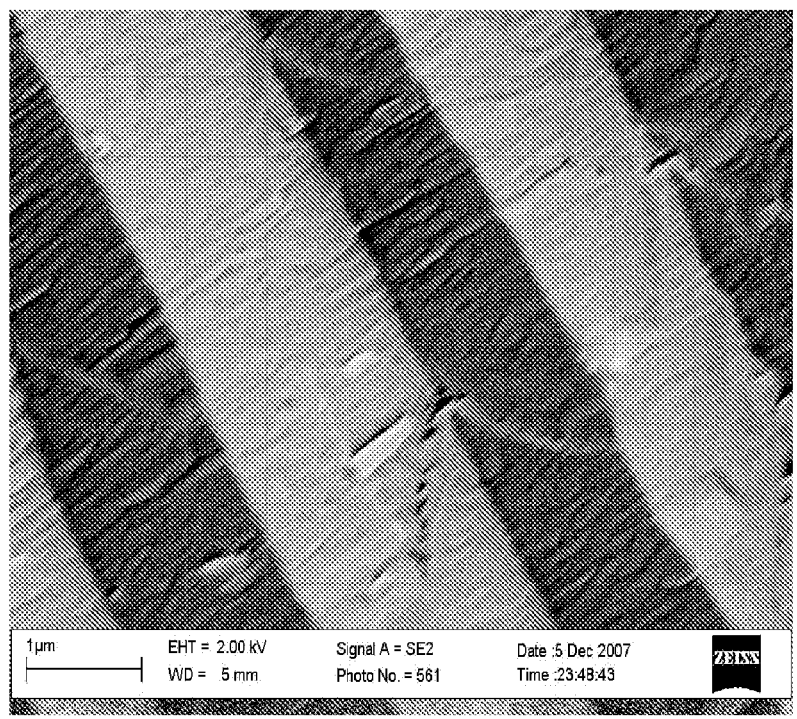
Figure 11C:
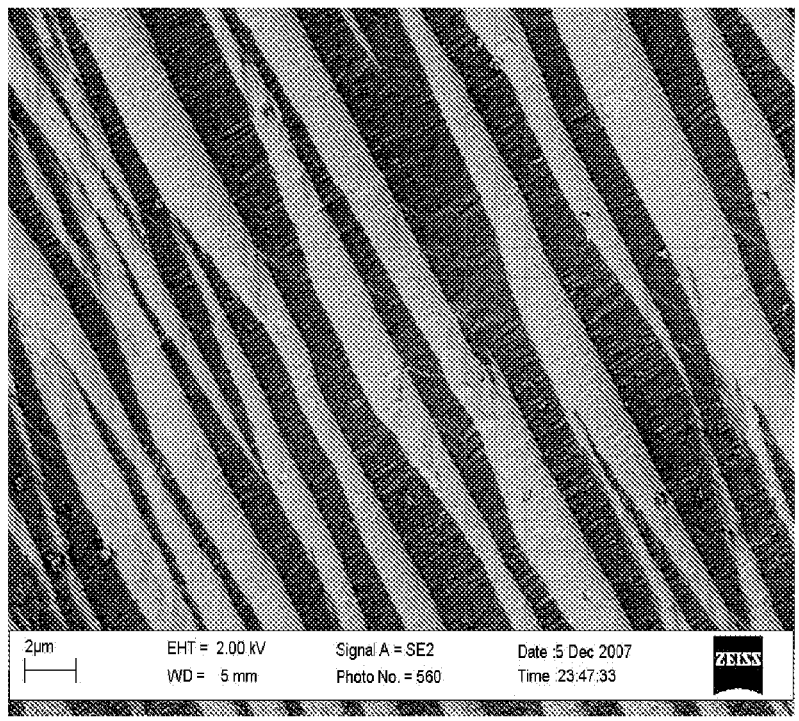
Figure 11D:
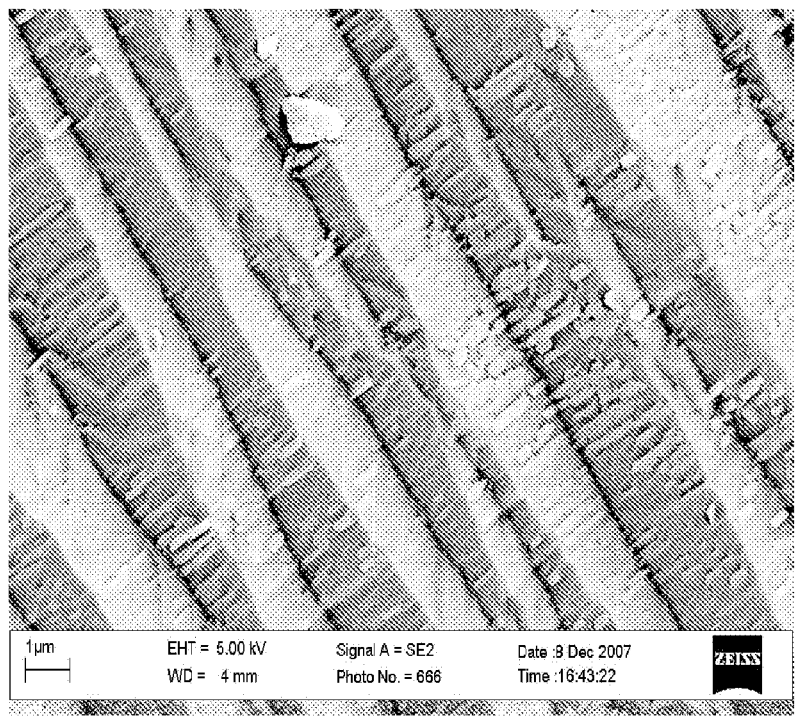

FIG. 10 shows the luminescence spectra as a function of temperature as well as the integrated photoluminescence as a function of inverse temperature for InGaN/GaN MQWS grown on a nonpolar A-plane GaN template. The composition of these InGaN QWs was chosen for emission in the blue. The IQE of these MQWs at room temperature was evaluated by taking the ratio of the luminescence at room temperature to that at 10° K. and found to be 70%. This high value of the IQE is the result of the elimination of the polarization effects in these MQWs.

EXAMPLE VI

Figure 15:
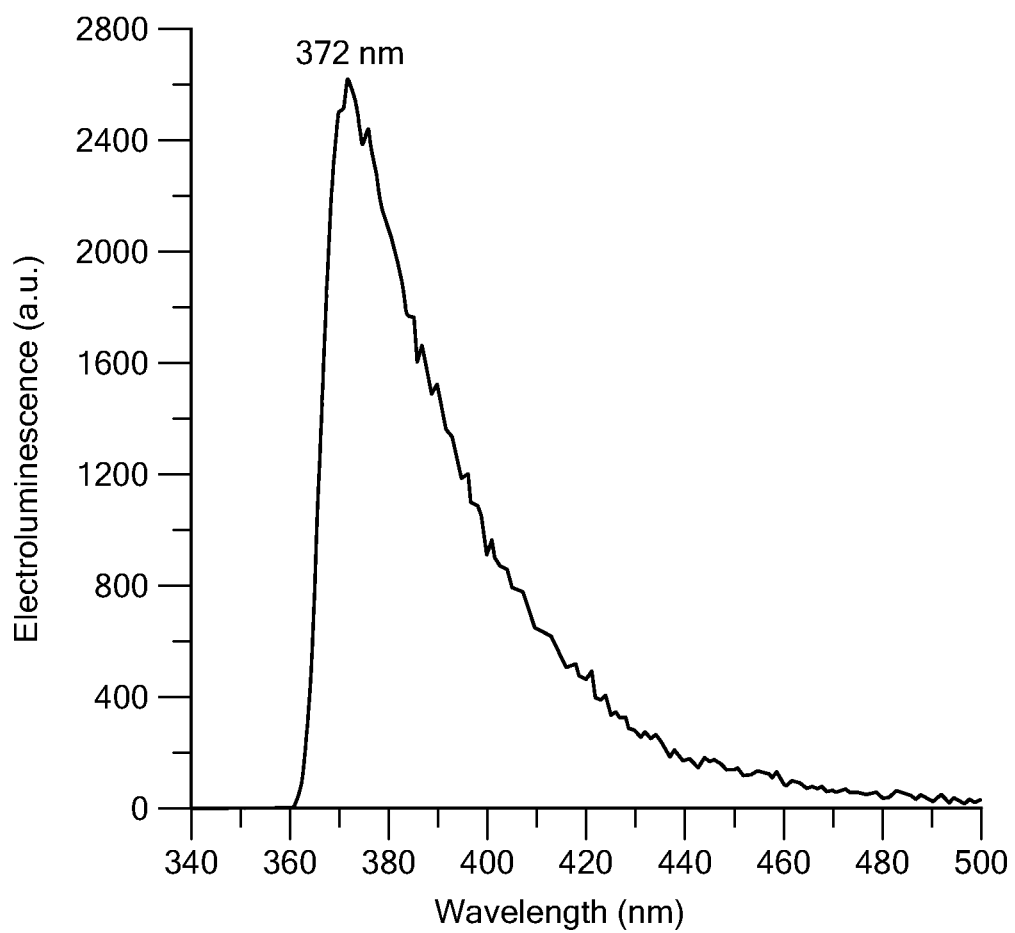
FIG. 15 shows the electroluminescence spectrum of a UV-LED grown on a textured nonpolar A-GaN template.

Fabrication and Characterization of an LED Structure on a Textured Nonpolar GaN Template An LED structure emitting at 360 nm was formed as indicated schematically in FIG. 5C using a textured A-GaN template as a substrate. A textured A-plane GaN template was grown by HVPE on R-plane sapphire. An n-doped (Si-doped) GaN first layer was applied by MBE on the A-GaN template. Three AlGaN/AlGaN MQWs were deposited by MBE on the first layer. A p-doped AlGaN blocking layer was deposited on the MQWs, and a p-doped GaN upper layer was deposited on the blocking layer. The electroluminescence spectrum was determined at the wafer level by pulsing the LED at 10 kHz using 1.4 mA and 7.3V and is shown in FIG. 15. The peak emission was 372 nm. The abrupt cut-off of the spectrum at short wavelengths was due to the absorption of light from the top p-GaN layer. Alternatively, a p-AlGaN could be used as the top layer for better light extraction.

What is claimed is:

1. A method for fabrication of a semiconductor structure, the method comprising:
   providing a substrate comprising a smooth surface having a predetermined material orientation, the substrate comprising a material selected from the group consisting of R-plane sapphire, A-plane silicon carbide, A-plane zinc oxide, A-plane gallium nitride, A-plane aluminum nitride and A-plane aluminum gallium nitride; and
   depositing a first layer comprising a III-nitride material onto the smooth surface of the substrate, the first layer comprising an upper surface with a triangular texture as grown, wherein the faces of the triangles are the M-planes of the III-nitride material, and wherein the material comprises A-planes parallel to said predetermined material orientation.

2. The method of claim 1 further including depositing an upper layer onto the first layer, the upper layer comprising a III-nitride material, wherein the first layer and the upper layer comprise opposite p and n dopants, a p-n junction is formed between the first layer and the upper layer, and the upper layer replicates the texture of the first layer.

3. The method of claim 1, further including depositing one or more quantum wells on said first layer and depositing an upper layer onto the uppermost quantum well; wherein the quantum wells comprise a III-nitride material, the upper layer comprises a III-nitride material, and the quantum wells and upper layer replicate the texture of the first layer.

4. The method of claim 1, wherein the first layer is deposited by a method comprising one of halide vapor phase epitaxy, metal organic chemical vapor deposition, molecular beam epitaxy, liquid phase epitaxy, laser ablation or a combination of these methods.

5. The method of claim 1, wherein the step of depositing said first layer provides a growth rate of at least 100μ per hour.

6. A method for fabrication of a semiconductor device, the method comprising:
   providing a substrate, the substrate comprising a material selected from the group consisting of R-plane sapphire, A-plane silicon carbide, A-plane zinc oxide, A-plane gallium nitride, A-plane aluminum nitride, and A-plane aluminum gallium nitride, wherein the substrate comprises a smooth surface having a predetermined material orientation;
   depositing a first layer comprising a III-nitride material onto the smooth surface of the substrate, the first layer comprising an upper surface with a triangular texture as grown, wherein the faces of the triangles are the M-planes of the III-nitride material, and wherein the material comprises A-planes parallel to said predetermined material orientation;
   depositing one or more quantum wells onto the first layer, the quantum wells comprising a III-nitride material and textured by the upper surface of the first layer; and
   depositing an upper layer onto the uppermost quantum well, the upper layer comprising a III-nitride material and textured by the uppermost quantum well, wherein deposition of the first layer and the upper layer includes depositing the layers with opposite p and n dopants to comprise a p-n junction therebetween.

7. The method of claim 6, wherein the first layer is deposited by a method comprising one of halide vapor phase epitaxy, metal organic chemical vapor deposition, molecular beam epitaxy, liquid phase epitaxy, laser ablation or a combination of these methods.

8. The method of claim 6, wherein the step of depositing said first layer provides a growth rate of at least 100μ per hour.

9. A semiconductor device comprising:
   a substrate comprising a smooth surface having a predetermined material orientation, the substrate comprising a material selected from the group consisting of R-plane sapphire, A-plane silicon carbide, A-plane zinc oxide, A-plane gallium nitride, A-plane aluminum nitride, and A-plane aluminum gallium nitride;
   a first layer comprising a III-nitride material having an upper surface with a triangular texture as grown, wherein the faces of the triangles are the M-planes of the III-nitride material, and wherein the material comprises A-planes parallel to said predetermined material orientation;
   one or more quantum wells, each comprising a quantum well layer and a barrier layer, the quantum well layer and barrier layer each comprising a III-nitride material having a nonpolar plane oriented parallel to the M-plane of the first layer, and the one or more quantum wells overlaying the first layer; and
   an upper layer comprising a III-nitride material, the upper layer overlaying the one or more quantum wells and textured by the uppermost quantum well; wherein the upper layer is grown on the uppermost quantum well layer, and the first layer and the upper layer have opposite p and n dopants to form a p-n junction between the first layer and the upper layer.

10. The semiconductor device of claim 9, wherein the first layer is deposited by a method comprising one of halide vapor phase epitaxy, metal organic chemical vapor deposition, molecular beam epitaxy, liquid phase epitaxy, laser ablation or a combination of these methods.

11. The semiconductor device of claim 9, wherein the device has one or more of the following properties: the textured surface of said first layer has a reflectivity of less than 1% over 325 nm to 700 nm; the photoluminescence of the textured surface of said quantum wells is at least 90 times higher than the photoluminescence of an untextured surface of the same material; the substrate is sapphire and the first layer is grown on the R-plane of the sapphire substrate; the textured surface of said first layer is characterized by a series of elongated facets, each facet having approximately 120° orientation to adjacent facets; the entire surface of said first layer covered by said one or more quantum wells is textured; the first layer comprises gallium nitride; the group III-V material of said first layer and said upper layer is gallium nitride; said one or more quantum wells comprise AlGaN, InGaN, or a combination of both; and the device is a light emitting diode.

12. The semiconductor device of claim 9, wherein the light extraction efficiency of the device is at least 99% and the internal quantum efficiency of the device is at least 70%.

13. A semiconductor structure comprising
   a substrate comprising a smooth surface having a predetermined material orientation, the substrate comprising a material selected from the group consisting of R-plane sapphire, A-plane silicon carbide, A-plane zinc oxide, A-plane gallium nitride, A-plane aluminum nitride, and A-plane aluminum gallium nitride;
   a first layer comprising a III-nitride material having an upper surface with a triangular texture as grown, wherein the faces of the triangles are the M-planes of the III-nitride material, and wherein the material comprises A-planes parallel to said predetermined material orientation, the first layer overlaying the smooth surface of the substrate; and an upper layer comprising a III-nitride material, the upper layer overlaying the first layer and textured by the first layer; wherein the upper layer is grown on the first layer, and the first layer and the upper layer have opposite p and n dopants to form a p-n junction between the first layer and the upper layer.

14. The semiconductor device of claim 13, wherein the device has one or more of the following properties: the textured surface of said first layer has a reflectivity of less than 1% over 325 nm to 700 nm; the photoluminescence of the textured surface of said quantum wells is at least 90 times higher than the photoluminescence of an untextured surface of the same material; the substrate is sapphire and the first layer is grown on the R-plane of the sapphire substrate; the textured surface of said first layer is characterized by a series of elongated facets, each facet having approximately 120° orientation to adjacent facets; the entire surface of said first layer covered by said one or more quantum wells is textured; the first layer comprises gallium nitride; the group III-V material of said first layer and said upper layer is gallium nitride; said one or more quantum wells comprise AlGaN, InGaN, or a combination of both; and the device is a light emitting diode.

15. The semiconductor device of claim 13, wherein the light extraction efficiency of the device is at least 99% and the internal quantum efficiency of the device is at least 70%.

16. A template for the formation of a semiconductor device, the template comprising a nonpolar III-nitride material and formed as a layer having an upper surface and a lower surface, the upper surface having a textured as grown topology and having a nonpolar plane oriented parallel to the lower surface.

17. The template of claim 16, wherein the III-nitride material is selected from the group consisting of A-plane gallium nitride, A-plane aluminum nitride and A-plane aluminum gallium nitride.

18. The template of claim 16, further comprising a substrate bound to the lower surface of the template, the substrate comprising a material selected from the group consisting of R-plane sapphire, A-plane silicon carbide, A-plane zinc oxide, A-plane gallium nitride, A-plane aluminum nitride and A-plane aluminum gallium nitride.

* * * * *